US007882467B2

(12) United States Patent
Kuchii

(10) Patent No.: US 7,882,467 B2
(45) Date of Patent: Feb. 1, 2011

(54) TEST PATTERN EVALUATION METHOD AND TEST PATTERN EVALUATION DEVICE

(75) Inventor: Toshimasa Kuchii, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 295 days.

(21) Appl. No.: 12/243,314

(22) Filed: Oct. 1, 2008

(65) Prior Publication Data

US 2009/0094569 A1    Apr. 9, 2009

(30) Foreign Application Priority Data

Oct. 4, 2007    (JP)    ............... 2007-261333

(51) Int. Cl.
*G06F 17/50*    (2006.01)
(52) U.S. Cl. .................. 716/4; 716/5; 716/6; 324/765; 702/59
(58) Field of Classification Search .............. 716/4–6; 324/765; 702/59
See application file for complete search history.

(56) References Cited

U.S. PATENT DOCUMENTS

| 6,714,032 | B1 * | 3/2004 | Reynick | ............ 324/765 |
| 7,404,158 | B2 * | 7/2008 | Nakajima | ............ 716/4 |
| 2003/0126568 | A1 | 7/2003 | Murakami | |
| 2006/0090147 | A1 | 4/2006 | Nakajima | |

FOREIGN PATENT DOCUMENTS

| JP | 2003-108623 A | 4/2003 |
| JP | 2003-197746 | 7/2003 |
| JP | 2006-118880 | 5/2006 |

OTHER PUBLICATIONS

Weiwei Mao et al. "Quietest: A Quiescent Current Testing Methodology for Detecting Leakage Faults", ICCAD 1990, IEEE pp. 280-283.

* cited by examiner

*Primary Examiner*—Naum B Levin
(74) *Attorney, Agent, or Firm*—Nixon & Vanderhye, P.C.

(57) ABSTRACT

Provided are an evaluation method and device of a test pattern which enable an appropriate evaluation in a reliability test with a simulation time reduced and high accuracy. It is assumed that each possible internal state of a cell determined at least by a logic value or a voltage value of an input terminal is a cell state, and each possible state of a transistor determined by a voltage between terminals of the transistor is a transistor state. The method comprises steps of: verifying operation of a semiconductor integrated circuit at a gate level or higher; acquiring an appearance cell state continuously appearing for a predetermined time or more in the operation verification; acquiring an appearance transistor state using the corresponding appearance cell state in the operation verification for each transistor; and calculating a test activity ratio of the transistor using the corresponding appearance transistor state for each transistor.

15 Claims, 15 Drawing Sheets

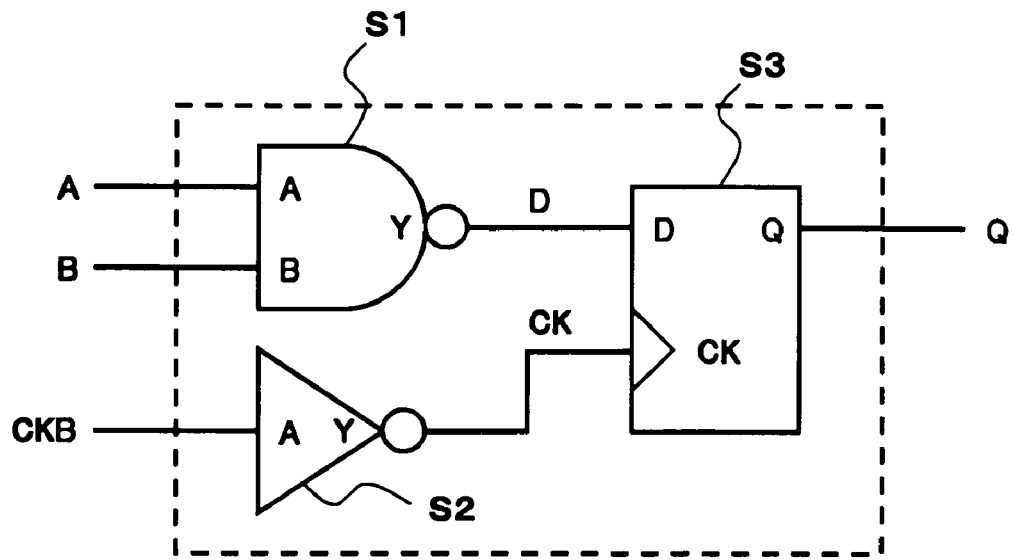
FIG. 3
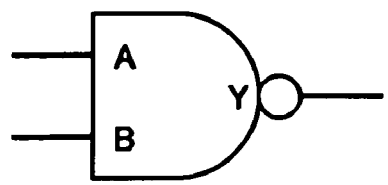
FIG. 5A
| A | B | Y |
|---|---|---|
| 0 | 0 | 1 |
| 0 | 1 | 1 |
| 1 | 0 | 1 |
| 1 | 1 | 0 |
FIG. 5B

| A | B | CKB | |
|---|---|-----|---|
| 1 | 1 | 1 | // 0ns |
| 1 | 1 | 1 | // 1ns |
| 1 | 1 | 1 | // 2ns |
| 1 | 1 | 1 | // 3ns |
| 1 | 1 | 1 | // 4ns |
| 1 | 1 | 0 | // 5ns |
| 1 | 1 | 0 | // 6ns |
| 1 | 1 | 0 | // 7ns |
| 1 | 1 | 0 | // 8ns |
| 1 | 1 | 0 | // 9ns |
| 1 | 1 | 0 | // 10ns |
| 1 | 0 | 1 | // 11ns |
| 1 | 0 | 1 | // 12ns |
| 1 | 0 | 1 | // 13ns |
| 1 | 0 | 1 | // 14ns |
| 1 | 0 | 1 | // 15ns |
| 1 | 0 | 0 | // 16ns |
| 1 | 0 | 0 | // 17ns |
| 1 | 0 | 0 | // 18ns |
| 1 | 0 | 0 | // 19ns |
| 1 | 0 | 0 | // 20ns |
| 0 | 1 | 1 | // 21ns |
| 0 | 1 | 1 | // 22ns |
| 0 | 1 | 1 | // 23ns |
| 0 | 1 | 1 | // 24ns |
| 0 | 1 | 1 | // 25ns |
| 0 | 1 | 0 | // 26ns |

FIG. 4

```
NAND        INV         DFF
(A,B)       (A)         (D,CK,Q)
(11)=10ns   (1)=15ns    (111)= 4ns
(10)=10ns   (0)=11ns    (110)= 1ns
(01)= 6ns               (101)= 5ns
(00)= 0ns               (100)= 5ns
                        (011)= 0ns
                        (010)= 4ns
                        (001)= 0ns
                        (000)= 0ns
```

| m2 | Y | A | VDD | VDD | TP |
| m3 | Y | B | VDD | VDD | TP |
| m1 | Y | A | F   | GND | TN |
| m0 | F | B | GND | GND | TN |

| NA2(A,B) | | 00 | 01 | 10 | 11 |
|---|---|---|---|---|---|
| m0 | Vgs | 0 | 1 | 1 | 1 |
|    | Vds | 0 | 0 | 1 | 0 |
|    | Vgd | 0 | 1 | 0 | 1 |
| m1 | Vgs | 1 | 1 | 0 | 1 |
|    | Vds | 1 | 1 | 0 | 0 |
|    | Vgd | 0 | 0 | 0 | 1 |
| m2 | Vgs | 1 | 1 | 0 | 1 |
|    | Vds | 0 | 0 | 0 | 1 |
|    | Vgd | 1 | 1 | 0 | 0 |
| m3 | Vgs | 1 | 0 | 1 | 0 |
|    | Vds | 0 | 0 | 0 | 1 |
|    | Vgd | 1 | 0 | 1 | 1 |

| NAND(A,B) | | |
|---|---|---|
| m0 | Vgs | 26ns |
|    | Vds | 10ns |
|    | Vgd | 16ns |
| m1 | Vgs | 16ns |
|    | Vds | 6ns |
|    | Vgd | 10ns |
| m2 | Vgs | 16ns |
|    | Vds | 10ns |
|    | Vgd | 6ns |
| m3 | Vgs | 10ns |
|    | Vds | 10ns |
|    | Vgd | 20ns | simulation totaltime[ps] = 104484000000

| instance | library | transistor | vgs_active_time[ps] | | vds_active_time[ps] | | vgd_active_time[ps] | | active? |
|---|---|---|---|---|---|---|---|---|---|
| TOP.I0.I1.I10 | AN2 | m0 | 75498084330 | 72.26% | 15862660 | 0.02% | 75482221670 | 72.24% | 1 |
| TOP.I0.I1.I10 | AN2 | m1 | 104460022040 | 99.98% | 29557471720 | 28.29% | 74902550320 | 71.69% | 1 |
| TOP.I0.I1.I10 | AN2 | m2 | 103896213350 | 99.44% | 74902550320 | 71.69% | 28993663030 | 27.75% | 1 |
| TOP.I0.I1.I10 | AN2 | m3 | 29557471720 | 28.29% | 74902550320 | 71.69% | 104460022040 | 99.98% | 1 |
| TOP.I0.I1.I11 | AN2 | m0 | 29573334380 | 28.30% | 74902550320 | 71.69% | 104475884700 | 99.99% | 1 |
| TOP.I0.I1.I11 | AN2 | m1 | 29573334380 | 28.30% | 74902550320 | 71.69% | 104475884700 | 99.99% | 1 |
| TOP.I0.I1.I11 | AN2 | m2 | 74902550320 | 71.69% | 29573334380 | 28.30% | 104475884700 | 99.99% | 1 |
| TOP.I0.I1.I11 | AN2 | m3 | 74902550320 | 71.69% | 29573334380 | 28.30% | 104475884700 | 99.99% | 1 |

FIG. 11

- A=0V, B=0V, VDD=6V
- A=0V, B=6V, VDD=6V
- A=6V, B=0V, VDD=6V
- A=6V, B=6V, VDD=6V

| | | | | | | | | | |
|---|---|---|---|---|---|---|---|---|---|
| AN2 | A,B | 00 | m3 | V(gs, ds, gd) | = | 6.000000 | 0.000000 | 6.000000 | ON(gs, ds, gd) | = | 1 |
| AN2 | A,B | 00 | m2 | V(gs, ds, gd) | = | 6.000000 | 0.000000 | 6.000000 | ON(gs, ds, gd) | = | 1 |
| AN2 | A,B | 00 | m1 | V(gs, ds, gd) | = | 6.000000 | 6.000000 | 0.000000 | ON(gs, ds, gd) | = | 0 |
| AN2 | A,B | 00 | m0 | V(gs, ds, gd) | = | 0.000000 | 0.000000 | 0.000000 | ON(gs, ds, gd) | = | 0 |
| AN2 | A,B | 01 | m3 | V(gs, ds, gd) | = | 0.000000 | 0.000000 | 0.000000 | ON(gs, ds, gd) | = | 0 |
| AN2 | A,B | 01 | m2 | V(gs, ds, gd) | = | 6.000000 | 6.000000 | 0.000000 | ON(gs, ds, gd) | = | 1 |
| AN2 | A,B | 01 | m1 | V(gs, ds, gd) | = | 6.000000 | 0.000000 | 6.000000 | ON(gs, ds, gd) | = | 0 |
| AN2 | A,B | 01 | m0 | V(gs, ds, gd) | = | 6.000000 | 0.000000 | 6.000000 | ON(gs, ds, gd) | = | 1 |
| AN2 | A,B | 10 | m3 | V(gs, ds, gd) | = | 4.648600 | 4.648600 | 0.000000 | ON(gs, ds, gd) | = | 1 |
| AN2 | A,B | 10 | m2 | V(gs, ds, gd) | = | 1.351400 | 0.000000 | 1.351400 | ON(gs, ds, gd) | = | 0 |
| AN2 | A,B | 10 | m1 | V(gs, ds, gd) | = | 0.000000 | 1.351400 | 0.000000 | ON(gs, ds, gd) | = | 0 |
| AN2 | A,B | 10 | m0 | V(gs, ds, gd) | = | 6.000000 | 0.000000 | 6.000000 | ON(gs, ds, gd) | = | 1 |

FIG. 15

TEST PATTERN EVALUATION METHOD AND TEST PATTERN EVALUATION DEVICE

CROSS REFERENCE TO RELATED APPLICATION

This Nonprovisional application claims priority under 35 U.S.C. §119(a) on Patent Application No. 2007-261333 filed in Japan on Oct. 4, 2007, the entire contents of which are hereby incorporated by reference.

BACKGROUND OF THE INVENTION

1. Field of the Invention

The present invention relates to a test pattern evaluation method and a test pattern evaluation device for a reliability test of a semiconductor integrated circuit.

2. Description of the Related Art

Conventionally, in order to ship a highly reliable semiconductor integrated circuit device, various kinds of reliability tests are performed for the semiconductor integrated circuit device before shipment. The reliability tests include an endurance test for a gate oxide film of a transistor constituting a semiconductor integrated circuit. More specifically, in the endurance test for the gate oxide film of the transistor, while an endurance testing power supply voltage higher than a rated voltage is applied to a power supply terminal of the semiconductor integrated circuit in a high-temperature environment, depending on a process, characteristics and the like, an input signal produced based on a test pattern for testing endurance of the gate oxide film of the transistor is inputted to an input terminal of the semiconductor integrated circuit. Thus, in the endurance test for the gate oxide film of the transistor, the endurance testing voltage is applied to the gate oxide film of the transistor to be tested for a time required for the reliability test.

Meanwhile, in the reliability test for the gate oxide film of the transistor, in order to improve the precision of the reliability test, it is necessary to apply an appropriate endurance testing voltage to all the transistors constituting the semiconductor integrated circuit for an appropriate period of time. When the endurance testing voltage and the voltage application time for the transistor are varied, there is a possibility that the precision of the reliability test is lowered. Therefore, it is necessary to produce a reliability testing test pattern in which an endurance testing voltage can be applied to all the transistors constituting the semiconductor integrated circuit for an appropriate time.

In general, when the semiconductor integrated circuit is large in size especially, since it is difficult to apply the endurance testing voltage to all the transistors constituting the semiconductor integrated circuit for the appropriate time in one reliability testing test pattern, a plurality of reliability testing test patterns are used in some cases. Alternatively, as the size of the semiconductor integrated circuit becomes large, a length of one reliability testing test pattern tends to be increased. However, when the number of reliability testing test patterns is increased or when the length of the reliability testing test pattern is increased, a testing time of the endurance test is increased considerably. Therefore, it is required to produce a high-precision reliability testing test pattern, reduce the number of reliability testing test patterns, and reduce the testing time of the endurance test, and a technique to appropriately evaluate the precision of the reliability testing test pattern is required.

A technique for evaluating the reliability testing test pattern includes a test pattern evaluating technique in which with a SPICE (Simulation Program with Integrated Circuit Emphasis) netlist of a semiconductor integrated circuit and the reliability testing test pattern, SPICE simulation is performed at a transistor level, a transistor to which an endurance testing voltage is applied for an appropriate time is extracted as an activation transistor, and an activation rate (stress activation rate) of the transistor in the whole semiconductor integrated circuit is calculated from a ratio of the activation transistors to all the transistors in the semiconductor integrated circuit (refer to Japanese Patent Application Laid-Open No. 2006-118880 (hereinafter referred to as the patent document 1), for example).

The evaluation technique of the test pattern disclosed in the patent document 1 will be briefly described with reference to FIGS. 18 and 19.

First, a constitution of an inspection device used in the test pattern evaluation technique disclosed in the patent document 1 will be described with reference to FIG. 18. Here, FIG. 18 shows one example of the inspection device for a semiconductor integrated circuit, especially, a schematic constitution example of a part regarding the SPICE simulation.

As shown in FIG. 18, an inspection device 1000 comprises a CPU (Central Processing Unit) 1010 controlling various kinds of functions of the inspection device 1000, a SPICE simulation program 1021 composed of processing procedures of the SPICE simulation, a HDD (Hard Disk Drive) 1020 storing a SPICE netlist 1022 of the semiconductor integrated circuit, a reliable testing test pattern 1023 and the like, a RAM (Random Access memory) 1030 as a temporal memory device composed of a flash memory and the like, an operation unit 1040 comprising external input devices such as a keyboard and a mouse from which setting and operation request of the SPICE simulation can be inputted, a display unit 1050 comprising a device such as a display capable of displaying a result of the SPICE simulation and the like, and a communication interface 1060 for data communication with another device on a LAN (Local Area network).

The inspection device 1000 carries out a reliability test for the semiconductor integrated circuit in which the CPU 1010 carries out the SPICE simulation program 1021 using the SPICE netlist 1022 and the reliability testing test pattern 1023 stored in the HDD 1020, based on an execution instruction for the SPICE simulation from the operation unit 1040.

Next, the execution procedures of the test pattern evaluation technique described in the patent document 1 will be described with reference to FIG. 19. Here, FIG. 19 shows the process procedures of the evaluation technique of the reliability testing test pattern according to the conventional technique.

When the CPU 1010 of the inspection device 1000 receives the execution request for the SPICE simulation from the operation unit 1040, it acquires the designated SPICE netlist 1022 and reliability testing test pattern 1023 from the HDD 1020, and executes the SPICE simulation program 1021 stored in the HDD 1020 to start the simulation at a transistor level (step #1001).

The CPU 1010 extracts transistor names of all the transistors and each node of each transistor from the SPICE netlist 1022 to form a transistor list (step #1002). Furthermore, the CPU 1010 executes the SPICE simulation or uses a log of the SPICE simulation to acquire a voltage change of each node of each transistor (step #1003).

After the CPU 1010 acquires the results of the SPICE simulation for all the transistors ("YES" branch in step #1004), it acquires a stress application time for each transistor in which an endurance testing voltage is applied to the gate oxide film of the transistor from the result of the SPICE simulation (step #1005), and calculates a ratio of the stress application time to total SPICE simulation time (stress application rate) (step #1006).

After the CPU 1010 calculates the stress application rates of all the transistors ("YES" branch in step #1007), the CPU 1010 acquires the number of transistors whose value of the stress application rate is not less than a certain value (step #1008), and calculates a ratio of such transistor number to the total transistor number in the semiconductor integrated circuit, as a transistor activation rate (step #1009) and outputs it to the display unit 1050. Finally, the test pattern is evaluated using the transistor activation rate as an evaluation index of the reliability testing test pattern 1023.

In addition, although the transistor activation rate showing the application state of the endurance testing voltage to the gate oxide film of the transistor is used as the evaluation index of the test pattern, in the above evaluation technique of the test pattern, as another evaluation technique of the test pattern, a toggle rate is used as the evaluation index of the test pattern, for example (refer to Japanese Patent Application Laid-Open No. 2003-197746 (hereinafter referred to as the patent document 2), for example).

The toggle rate is an activation rate of a bus connecting an output terminal of a certain cell to an input terminal of another cell, in a semiconductor integrated circuit; it is shown by a ratio of the bus number capable of changing a logic value to "0" and "1" to the total bus number. The toggle rate is used in a logic circuit that is designed using a library made based on a standard cell composed of about several to several tens of transistors especially.

However, according to the evaluation technique of the test pattern disclosed in the patent document 1, since the voltage characteristics are analyzed at the transistor level by the SPICE simulation, the simulation time is considerably long. Especially, when transient analysis of the SPICE is used to perform the simulation with high accuracy, the simulation time is enormously long and the problem is that the SPICE simulation cannot be completed in a realistic time. Furthermore, as the semiconductor integrated circuit becomes large recently, the SPICE simulation time is increased accordingly, so that it becomes difficult to evaluate the reliability testing test pattern using the SPICE simulation like the evaluation technique of the test pattern disclosed in the patent document 1. Thus, an evaluation technique of the test pattern is required to be capable of acquiring a transistor activation rate using a simulation at a gate level (cell unit) in which a process can be completed in a realistic time comparatively even when the semiconductor integrated circuit becomes large.

In addition, according to the evaluation technique of the test pattern disclosed in the patent document 2, although the toggle rate showing the activation rate of the bus is used as the evaluation index of the test pattern, it is necessary to apply a logic value to the bus node in the semiconductor integrated circuit comprehensively in order to improve the toggle rate. Meanwhile, in the reliability test for the gate oxide film of the transistor, the voltage between the terminals of the transistor only has to be in a test voltage application state for a time required for the reliability test. That is, even when the test pattern has a high toggle rate, the evaluation of the reliability test for the gate oxide film of the transistor is not always high. The toggle rate, fault coverage and the like are not always suitable for the evaluation index of the reliability testing test pattern for the gate oxide film of the transistor.

SUMMARY OF THE INVENTION

The present invention was made in view of the above problems and an object of the present invention is to provide an evaluation method of a test pattern, the method being capable of reducing a simulation time and acquiring a transistor activation rate appropriately with high accuracy, by using a gate-level simulation having a relatively short simulation time as compared with a SPICE simulation.

In addition, another object of the present invention is to provide an evaluation device of a test pattern, the device being capable of reducing a simulation time and acquiring a transistor activation rate appropriately with high accuracy, by using a gate-level simulation having a relatively short simulation time as compared with a SPICE simulation.

A test pattern evaluation method according to the present invention to attain the above object is for evaluating a test pattern for verifying a semiconductor integrated circuit comprising a plurality of cells for implementing a specific function with a transistor, wherein it is assumed that each possible internal state of the cell determined at least by a logic value or a voltage value of an input terminal is a cell state, and each possible state of the transistor determined by a voltage between the terminals of the transistor is a transistor state, the method having a first characteristic of comprising: a step for verifying operation of the semiconductor integrated circuit at a gate level or higher using design data of the semiconductor integrated circuit and the test pattern; a step for acquiring the cell state continuously appearing in the cell for a predetermined time or more in the step for verifying the operation as an appearance cell state, with respect to each cell constituting the semiconductor integrated circuit; a step for acquiring the transistor state appearing in the transistor in the step for verifying the operation as an appearance transistor state, using the appearance cell state of the cell including the transistor, with respect to each transistor constituting the cell; and a step for calculating a test activity ratio of the transistor using the corresponding appearance transistor state, with respect to each transistor.

The test pattern evaluation method according to the present invention having the above characteristic is characterized as a second characteristic in that the step for calculating the test activity ratio includes: acquiring terminals of the transistor whose voltage has a possibility of being in a predetermined test voltage application state in view of a constitution of the semiconductor integrated circuit, as test possible terminals; and determining that the transistor in which the voltages between all the test possible terminals are in the test voltage application state in the step for verifying the operation is in a test activity state, with respect to each transistor.

The test pattern evaluation method according to the present invention having the first characteristic is characterized as a third characteristic in that the step for acquiring the transistor state includes acquiring an appearance time of the appearance transistor state with respect to each transistor, and the step for calculating the test activity ratio includes: acquiring terminals of the transistor whose voltage has a possibility of being in a predetermined test voltage application state in view of a constitution of the semiconductor integrated circuit, as test possible terminals; and calculating an accumulated test voltage application time with respect to each transistor by adding up times in which the voltage between the terminals is in the test voltage application state in the step for verifying the operation, with respect to all the test possible terminals in the semiconductor integrated circuit, using the appearance transistor state and the appearance time of each transistor; and determining that the transistor in which the accumulated test voltage application times of all the test possible terminals exceed a predetermined test voltage application state determination time is in a test activity state, with respect to each transistor.

The test pattern evaluation method according to the present invention having the second or third characteristic is characterized as a fourth characteristic of comprising a step for acquiring a ratio of the transistors determined as being in the test activity state to all the transistors to be verified in the semiconductor integrated circuit, as a first test activity ratio.

The test pattern evaluation method according to the present invention having the first characteristics is characterized as a fifth characteristic in that the step for calculating the test activity ratio includes: acquiring terminals of the transistor whose voltage has a possibility of being in a predetermined test voltage application state, in view of a constitution of the semiconductor integrated circuit, as test possible terminals; acquiring a ratio of the transistor terminals having a voltage becoming the test voltage application state in the step for verifying the operation to the test possible terminals with respect to each transistor; and executing a step for calculating a second test activity ratio by adding up the ratios with respect to all the transistors to be verified in the semiconductor integrated circuit.

The test pattern evaluation method according to the present invention having the first characteristic is characterized as a sixth characteristic in that the step for acquiring the transistor state includes acquiring an appearance time of the appearance transistor state with respect to each transistor, and the step for calculating the test activity ratio includes: acquiring terminals of the transistor whose voltage has a possibility of being in a predetermined test voltage application state, in view of a constitution of the semiconductor integrated circuit, as test possible terminals with respect to each transistor; calculating an accumulated voltage application time with respect to each transistor by adding up times in which the voltage between the terminals is in the test voltage application state in the step for verifying the operation, with respect to all the test possible terminals in the semiconductor integrated circuit, using the appearance transistor state and the appearance time of each transistor; acquiring a ratio of the terminals in which the accumulated test voltage application times exceed a predetermined test voltage application state determination time, to all the test possible terminals in the transistor, with respect to each transistor; and executing a step for calculating a second test activity ratio by adding up the ratios of all the transistors to be verified in the semiconductor integrated circuit.

The test pattern evaluation method according to the present invention having any one of the above characteristics is characterized as a seventh characteristic of comprising acquiring a correspondence data before the step for verifying the operation of the semiconductor integrated circuit, the correspondence data showing a correspondence relation between the cell state and a voltage between the terminals of the transistor constituting the cell with respect to each function of the cells wherein the step for acquiring the transistor state includes acquiring the appearance transistor state using the appearance cell state of the cell including the transistor and the correspondence data, with respect to each transistor.

The test pattern evaluation method according to the present invention having any one of the above characteristics is characterized as a eighth characteristic of comprising determining whether all the possible cell states of the cell appear or not using the appearance cell state of the cell with respect to each cell, and determining the cell in which all the possible cell states appear to be a test activation cell; and executing a step for acquiring a ratio of the test activation cells to all the cells to be verified in the semiconductor integrated circuit, as a first cell activity ratio.

The test pattern evaluation method according to the present invention having the first to seventh characteristics is characterized as a ninth characteristic in that the step for acquiring the cell state includes acquiring an accumulated cell state appearance time by adding up times in which the cell state appears in the cell with respect to each cell state, the method further comprising; determining the cell in which the accumulated cell state appearance times of all the possible cell states of the cell in view of the constitution of the semiconductor integrated circuit exceed a predetermined cell state appearance determination time, to be a test activation cell; and executing a step for acquiring a ratio of the test activation cells to all the cells to be verified in the semiconductor integrated circuit, as a first cell activity ratio.

The test pattern evaluation method according to the present invention having the first to seventh characteristics is characterized as a tenth characteristic of comprising: acquiring a ratio of the appearance cell states to all the possible cell states of the cell in view of the constitution of the semiconductor integrated circuit, using the appearance cell state of the cell, with respect to each cell; and executing a step for calculating a second activity ratio by adding up the ratios of all the cells to be verified in the semiconductor integrated circuit.

The test pattern evaluation method according to the present invention having the first to seventh characteristics is characterized as a eleventh characteristic in that the step for acquiring the cell state includes acquiring an accumulated cell state appearance time by adding up times in which the cell state appears in the cell with respect to the cell state, the method further comprising: acquiring a ratio of the cell states in which the accumulated cell state appearance times exceed a predetermined cell state appearance determination time, to all the possible cell states of the cell in view of the constitution of the semiconductor integrated circuit, with respect to each cell; and executing a step for calculating a second cell activity ratio by adding up the ratios of all the cells to be verified in the semiconductor integrated circuit.

The test pattern evaluation method according to the present invention having any one of the above characteristics is characterized as a twelfth characteristic of comprising: a step for acquiring the transistor state not appearing for a predetermine time or more in the cell in the step for verifying the operation, as a non-appearance transistor state, based on the appearance transistor state; and a step for producing a test pattern to produce the non-appearance transistor state.

The test pattern evaluation method according to the present invention having any one of the above characteristics is characterized as a thirteenth characteristic of comprising: a step for acquiring the cell state not appearing for a predetermine time or more in the cell in the step for verifying the operation, as a non-appearance cell state, based on the appearance cell state; and a step for producing a test pattern to produce the non-appearance cell state.

A test pattern evaluation device according to the present invention to attain the above object is for evaluating a test pattern for verifying a semiconductor integrated circuit comprising a plurality of cells for implementing a specific function with a transistor, wherein it is assumed that each possible internal state of the cell determined at least by a logic value or a voltage value of an input terminal is a cell state, and each possible state of the transistor determined by a voltage between the terminals of the transistor is a transistor state, the test pattern evaluation device comprising: data acquiring means for acquiring design data of the semiconductor integrated circuit and the test pattern; operation verifying means for executing operation verification of the semiconductor integrated circuit at a gate level or higher, using the design data and the test pattern; cell state acquiring means for acquiring the cell state continuously appearing in the cell for a predetermined time or more in the operation verification as an appearance cell state, with respect to each cell constituting the semiconductor integrated circuit; transistor state acquiring means for acquiring the transistor state appearing in the transistor in the operation verification as an appearance transistor state, using the appearance cell state of the cell including the transistor, with respect to each transistor constituting the cell; and test activity ratio calculating means for calculating a test activity ratio of the transistor using the corresponding appearance transistor state, with respect to each transistor.

According to the evaluation method and the evaluation device of the test pattern having the above characteristics, since the transistor state of the transistor constituting the cell is acquired from the internal state (cell state) that the cell can take, the reliability testing test pattern used in the reliability test for the gate oxide film of the transistor can be evaluated by the gate-level simulator with the same accuracy as that in the case where a transistor-level simulator is used.

According to the transistor-level simulation in which a voltage variation between the terminals of the transistor is measured like transient analysis of the SPICE simulation, although simulation accuracy is high, a simulation time is relatively long and in the case of the large-scaled semiconductor integrated circuit, it is difficult to complete the simulation in a realistic time. Meanwhile, according to the evaluation method and the evaluation device of the test pattern having the above characteristics, since the gate-level simulator in which a simulation time is relatively shorter than that of the transistor-level simulator can be used, even in the case of the large-scaled semiconductor integrated circuit, the simulation can be completed in the realistic time and the evaluation of the reliability testing test pattern can be performed in the realistic time.

In addition, according to the evaluation method and the evaluation device of the test pattern having the above characteristics, since the transistor state can be determined by the cell state uniquely, the transistor state is acquired from the cell state acquired in the operation verification (simulation), so that the reliability testing test pattern can be evaluated with the same accuracy as that in the case where the transistor-level simulation such as the SPICE simulation is executed.

In addition, when the evaluation method and the evaluation device of the test pattern having the above characteristics is constituted such that which are the test possible terminals in which the voltage between the terminals does not become the test voltage application state in the operation verification is outputted after the evaluation of the reliability testing test pattern, the test possible terminals requiring an additional reliability testing test pattern can be easily acquired, so that the additional reliability testing test pattern can be appropriately produced.

According to the evaluation method of the test pattern having the fourth characteristic, since the ratio of the transistors determined as being in the test activity state in the whole semiconductor integrated circuit is used as the evaluation index of the reliability testing test pattern, evaluation can be provided based on the transistor state in the actual operation verification, so that the evaluation in the reliability test for the gate oxide film and the source and drain of the transistor can be appropriately performed. According to the evaluation method of the test pattern having the fifth and sixth characteristics, since the value provided by adding up the ratios of the transistor terminals whose voltage becomes the test voltage application state in the operation verification to the test possible terminals, in the whole semiconductor integrated circuit is used as the evaluation index of the reliability testing test pattern, evaluation can be provided based on the transistor state in the actual operation verification, and the evaluation in the reliability test for the gate oxide film and the source and drain of the transistor can be appropriately performed.

In addition, according to the evaluation method of the test pattern having the third and sixth characteristics, since the accumulated test voltage application time provided by adding up the times in which the voltage between the terminals becomes the test voltage application state is used for calculation of the test activity ratio of the reliability testing test pattern, when a time required for the endurance test for the gate oxide film of the transistor is set to the test voltage application state determination time for example, the accumulated test voltage application time satisfies the voltage application state determination time, and the terminals of the transistor in which the reliability test can be appropriately performed can be surely evaluated, and the evaluation of the reliability testing test pattern can be implemented with higher accuracy.

According to the evaluation method of the test pattern having the seventh characteristic, since the correspondence data showing the correspondence relation between the cell state acquired before the operation verification and the voltage between the terminals of the transistor is acquired with respect to each cell function, and the transistor state is acquired from the cell state using the correspondence data, the transistor state can be easily and immediately acquired. In addition, the correspondence data can be reused in evaluation for another reliability testing test pattern used in a reliability test for the same semiconductor integrated circuit, and a reliability testing test pattern used in a reliability test for another semiconductor integrated circuit having the same manufacturing process or the same electric characteristics.

In addition, in the transistor-level simulation performed by the cell whose circuit scale is very small, since the simulation time is very short and the function number of the cell is limited, the simulation number can be small. Therefore, according to the evaluation method of the test pattern having the seventh characteristic, when the correspondence data is acquired, the transistor-level simulation such as the SPICE simulation can be used. In this case, since the transistor-level simulation is used, the correspondence relation between the cell state and the voltage between the terminals of the transistor can be acquired with higher accuracy. Furthermore, since the transistor-level simulation is not executed for the whole semiconductor integrated circuit in the operation verification, a time required for evaluating the reliability testing test pattern can be prevented from being increased.

In addition, according to the evaluation method of the test pattern having the eighth to eleventh characteristics, since the cell activity ratio is acquired based on the cell state appearing in each cell, the correspondence relation between the cell state and the voltage between the terminals of the transistor can be uniquely determined in view of the constitution of the semiconductor integrated circuit, so that the cell activity ratio can be acquired as the evaluation index in which the transistor state is reflected to some extent.

In addition, similarly to the case of the toggle rate, although the appearance rate of the cell state in the predetermined cell does not always coincide with a rate in which the test possible terminals of the transistor constituting the cell becomes the test voltage application state, in the cell in which all the possible cell states appear, it is considered that all the test possible terminals of the transistor constituting the cell are in the test voltage application state. Thus, even when the cell activity ratio is used, although it does not always coincide with the test activity ratio based on the transistor state, the evaluation of the reliability testing test pattern can be performed with high accuracy to some extent.

BRIEF DESCRIPTION OF THE DRAWINGS

FIG. 3 is a schematic block diagram showing one example of a semiconductor integrated circuit used in the test pattern evaluation method according to the first embodiment of the present invention;

FIG. 4 is a table showing one example of a test pattern used in the test pattern evaluation method according to the first embodiment of the present invention;

FIG. 5 is a view showing one example of a cell library;

FIG. 7 is a view showing one example of a cell library;

FIG. 11 is a table showing one example of a calculation result of an accumulated test voltage application time between the terminals of each transistor with respect to a simulation time;

FIG. 15 is a table showing a result of the SPICE simulation for the NAND cell and a correspondence relation between the cell state and the voltage between the terminals of the transistor;

DETAILED DESCRIPTION OF THE INVENTION

A test pattern evaluation method and a test pattern evaluation device (hereinafter, occasionally referred to as the "method of the present invention" and the "device of the present invention") will be described with reference to the drawings.

First Embodiment

A first embodiment of the method of the present invention and the device of the present invention will be described with reference to FIGS. 1 to 8.

First, a basic constitution of the device of the present invention will be described with reference to FIG. 1. Here, FIG. 1 shows a schematic partial constitution example regarding evaluation of a reliability testing test pattern 23 of an EWS1 (Engineering Workstation) comprising respective means of the device of the present invention.

Figure 1:
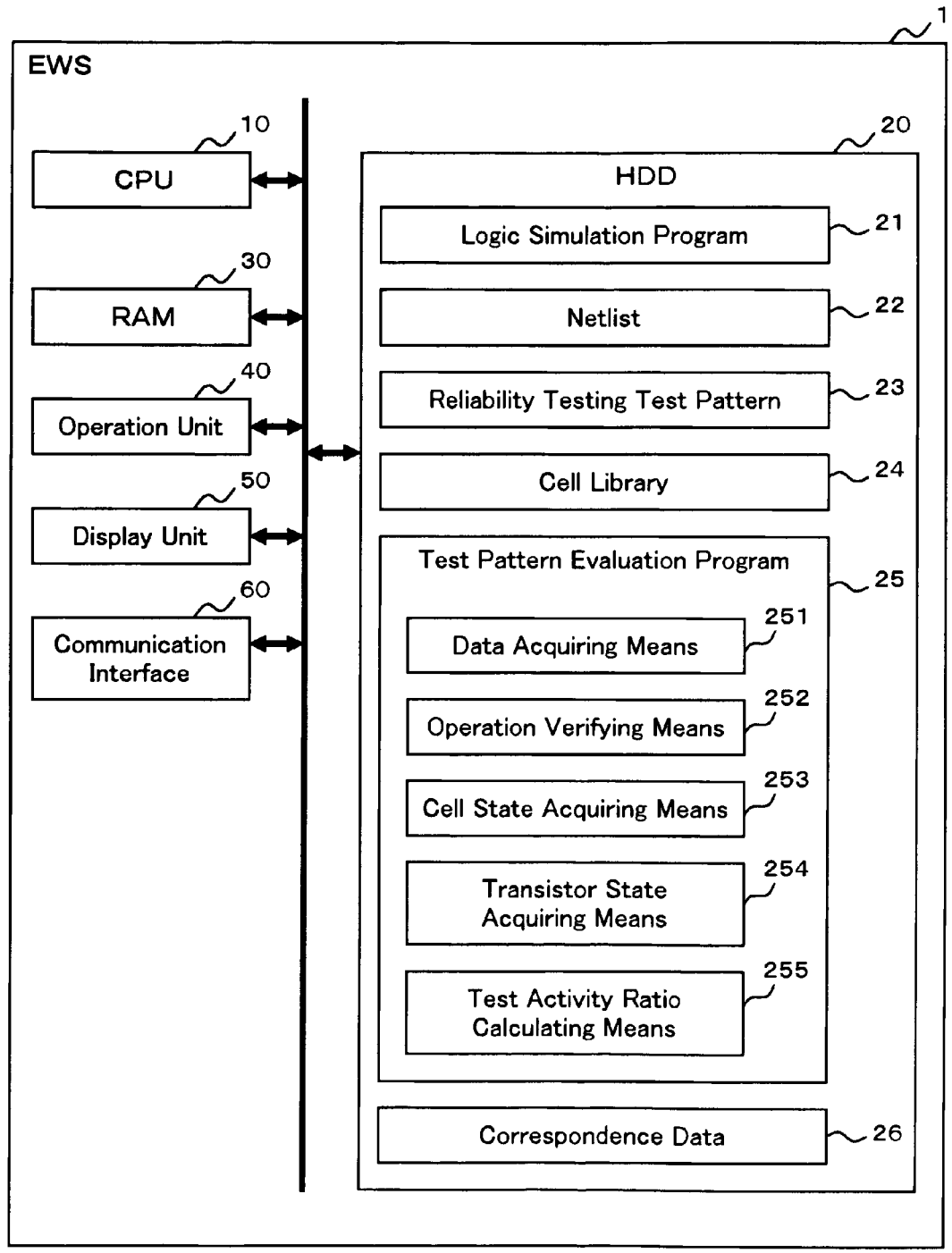
FIG. 1 is a block diagram showing a schematic partial constitution example of an EWS functioning as a test pattern evaluation device according to a first embodiment of the present invention.

As shown in FIG. 1, the EWS1 comprises a CPU 10 controlling each function of the EWS1, a HDD 20 storing various kinds of programs and data for implementing each function of the EWS1, a RAM 30 as a temporal memory device comprising a flash memory and the like, an operation unit 40 comprising external input devices such as a keyboard and a mouse, a display unit 50 comprising a device such as a display, and a communication interface 60 communicating data with another device on a LAN.

The HDD 20 in this embodiment comprises a logic simulation program 21 for performing operation verification of a semiconductor integrated circuit having a plurality of cells for implementing a specific function with a transistor at a gate level, a gate-level netlist 22 (corresponding to design data) of the semiconductor integrated circuit, a reliability testing test pattern 23 containing a function verifying test pattern, a cell library 24 in which a basic logic gate and a logic circuit block and the like are defined, a test pattern evaluation program 25 implementing respective means of a test pattern evaluation device for evaluating the reliability testing test pattern 23 of the semiconductor integrated circuit.

The device of the present invention is implemented when the test pattern evaluation program 25 is carried out by the CPU 10 on the computer. In addition, according to the device of the present invention and the method of the present invention, a cell state means each of possible internal states of a cell determined by at least a logic value or a voltage value of an input terminal, and a transistor state means each of possible states of a transistor determined by a voltage between the terminals of the transistor.

More specifically, as shown in FIG. 1, the device of the present invention comprises data acquiring means 251 for acquiring the netlist 22 of the semiconductor integrated circuit and the reliability testing test pattern 23, operation verifying means 252 for carrying out the operation verification of the semiconductor integrated circuit at the gate level or higher using the design data and the reliability testing test pattern 23, cell state acquiring means 253 for acquiring the cell state appearing in the cell for a predetermined time or more in the operation verification, as an appearance cell state, with respect to each cell constituting the semiconductor integrated circuit, a transistor state acquiring means 254 for acquiring the transistor state appearing in the transistor in the operation verification, as an appearance transistor state, using the appearance cell state of the cell composed of the transistor, with respect to each transistor composing the cell, and a test activity ratio calculating means 255 for calculating a test activity ratio of the transistor using the corresponding appearance transistor state, with respect to each transistor.

In addition, according to this embodiment, correspondence data 26 showing a correspondence relation between the cell state and the voltage between the terminals of the transistor constituting the cell is stored in the HDD 20 with respect to each function of the cell, and the transistor state acquiring means 254 acquires the appearance transistor state using the appearance cell state of the cell composed of the transistor and the correspondence data 26, with respect to each transistor.

Figure 2:
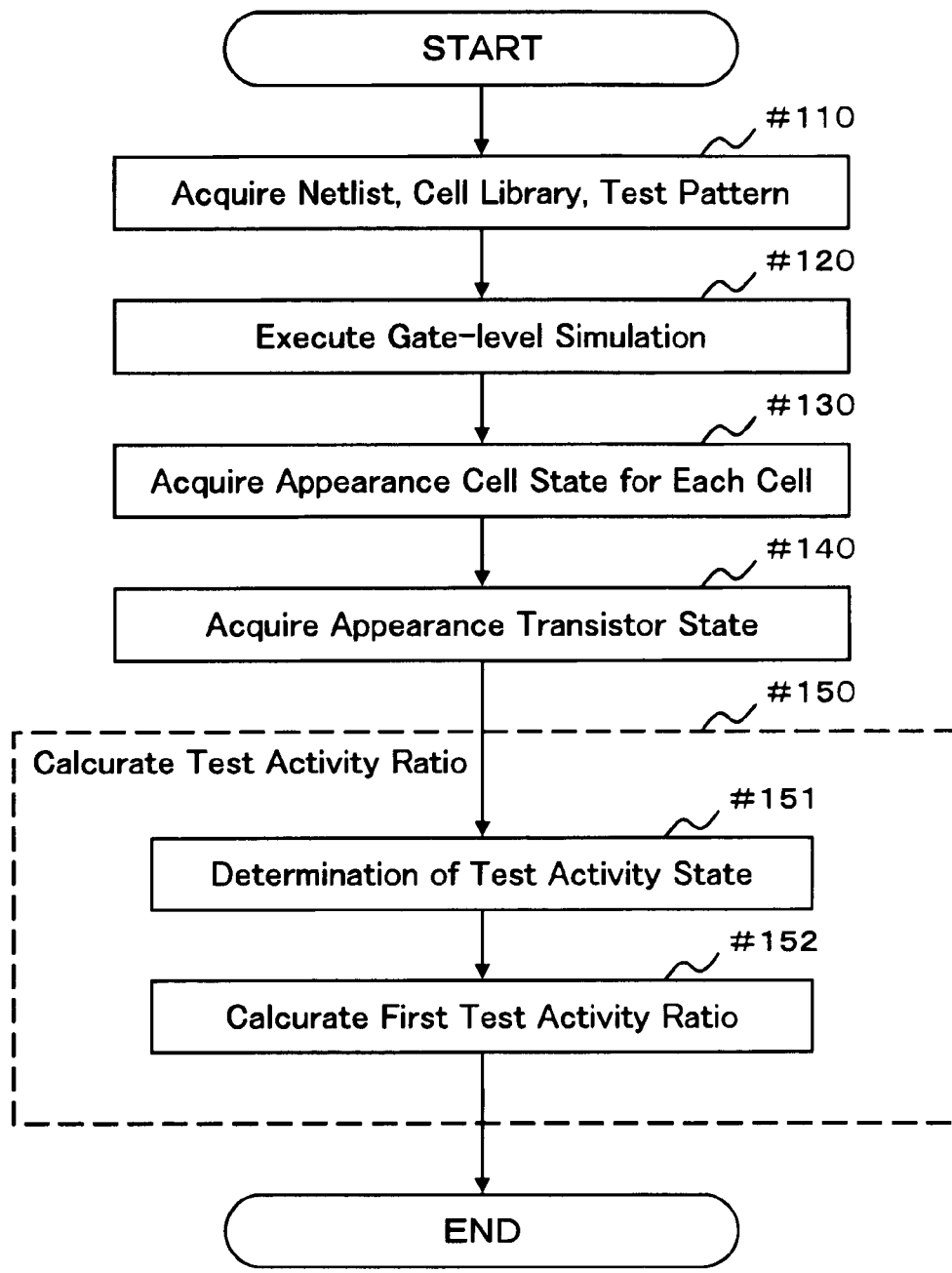
FIG. 2 is a flowchart showing a process procedure example of a test pattern evaluation method according to the first embodiment of the present invention.

Next, the method of the present invention in this embodiment will be described with reference to FIGS. 2 to 8. Here, FIG. 2 shows a process procedure of the method of the present invention in this embodiment.

When the operation unit 40 of the EWS1 requests the evaluation of the test pattern, the data acquiring means 251 in the device of the present invention acquires the gate-level netlist 22 of the designated semiconductor integrated circuit to be verified, the reliability testing test pattern 23, the cell library 24 from the HDD 20 (step #110), and the operation verifying means 252 of the device of the present invention starts the logic simulation program 21 and carries out the logic simulation (corresponding to the operation verification) at the gate level (step #120).

Here, FIG. 3 shows one example of the semiconductor integrated circuit as a target of the logic simulation. In addition, FIG. 4 shows one example of the reliability testing test pattern 23, in which input signals to be inputted to input terminals A, B and CKB of the semiconductor integrated circuit are expressed by logic values. FIG. 5 shows a symbol and a truth table of a NAND cell S1, as one example of the cell library 24 for the logic simulation. FIG. 6 shows a result of the logic simulation. In addition, in this embodiment, "1" corresponds to a power supply voltage at the time of reliability test (a test voltage, here) and "0" corresponds to the ground voltage.

More specifically, the semiconductor integrated circuit shown in FIG. 3 comprises the NAND cell S1, an inverter cell S2, and a D flip-flop cell S3. In addition, according to this embodiment, as for a combination circuit such as a logic gate and a selector in which a logic value of an output terminal is uniquely determined by a logic value of an input terminal, the cell state is defined by the logic value of the input terminal. In addition, as for a sequence circuit such as a register and a counter in which a logic value of an output value is determined by a logic value of an input terminal and an internal state, the cell state is defined by the logic values of the input terminal and the output terminal. That is, in the semiconductor integrated circuit shown in FIG. 3, the cell states are determined by the logic values of the input terminals in the NAND cell S1 and the inverter cell S2, and the cell state is defined by the logic value of the input terminal and the logic value of the output terminal in the D flip-flop cell S3.

Here, for example in the case of the NAND cell, although the cell states (A, B) are considered to be four cell states (0, 0), (0, 1), (1, 0) and (1, 1), when an input terminal B is fixed to the logic value "0", the possible cell states are (0, 0) and (1, 0) in view of the constitution of the semiconductor integrated circuit.

Figures 6A, 6B:
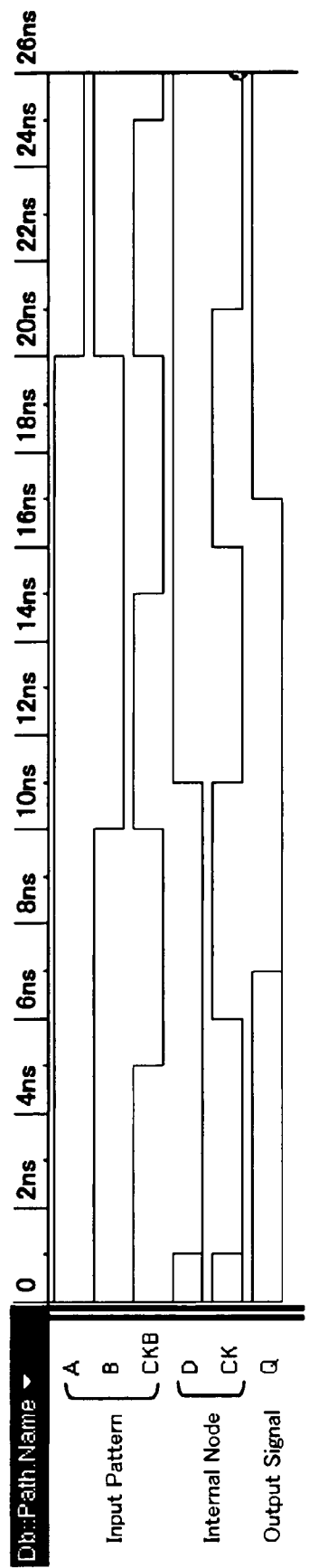
FIG. 6 is a timing chart showing a logic simulation result of the test pattern evaluation method according to the first embodiment of the present invention.

FIG. 6 shows the result of the logic simulation, in which FIG. 6A shows respective signal waveforms of an input signal A and an input signal B inputted to the NAND cell S1, a clock signal CKB inputted to the inverter cell S2, an internal signal D of an internal node connecting an output terminal Y of the NAND cell S1 and a data input terminal D of the D flip-flop cell S3, an internal signal CK of an internal node connecting an output terminal Y of the inverter cell S2 and a clock input terminal CK of the D flip-flop cell S3, and an output signal Q from the D flip-flop cell S3.

Then, as shown in FIG. 2, the cell state acquiring means 253 of the device of the present invention acquires the cell state continuously appearing in the cell for the predetermined time or more as the appearance cell state, with respect to each cell constituting the semiconductor integrated circuit, in the logic simulation (step #130, cell state acquiring step).

More specifically, in the case of the semiconductor integrated circuit shown in FIG. 3, the cell state acquiring means 253 in this embodiment acquires the appearance cell state with respect to the NAND cell S1, the inverter cell S2, and the D flip-flop cell S3. More specifically, the cell state appearing continuously for 1 ns or more is set as the appearance cell state in FIG. 6A. As shown in FIG. 6, as for the NAND cell S1, among the cell states (A, B) defined by the logic values of the input terminal A and the input terminal B, the appearance cell states (A, B) are (1, 1), (1, 0) and (0, 1). The appearance cell states (A) of the inverter cell S2 are (1) and (0). The appearance cell states (D, CK, Q) of the D flip-slop cell S3 are (1, 1, 1), (1, 1, 0), (1, 0, 1), (1, 0, 0) and (0, 1, 0). In addition, although the cell state continuously appearing for 1 ns or more is set as the appearance cell state in this embodiment, the present invention is not limited to this, and the appearance cell state may be appropriately set depending on the operation frequency of the semiconductor integrated circuit and the like.

Then, as shown in FIG. 2, the transistor state acquiring means 254 of the device of the present invention acquires the transistor state appearing in the transistor as the appearance transistor state, using the appearance cell state of the cell composed of the transistor, with respect to each transistor constituting the cell, in the logic simulation (step #140, transistor state acquiring step).

Figures 7A, 7B, 8, 9:
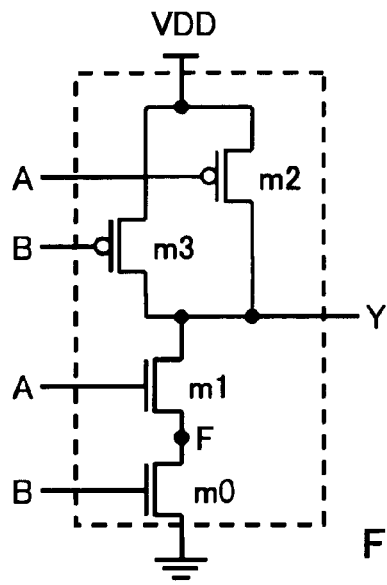
FIG. 8 is a table showing one example of a correspondence data used in the test pattern evaluation method according to the first embodiment of the present invention.
FIG. 9 is a table showing one example of the correspondence data used in the test pattern evaluation method according to the first embodiment of the present invention.

Here, FIG. 7 is a circuit diagram showing a transistor constitution of the NAND cell S1 and its connected constitution as one example of the cell library 24, and a SPICE netlist 28. FIG. 8 shows one partial example of the correspondence data 26 showing the correspondence relation between the cell state and the voltage between the terminals of the transistor constituting the cell with respect to each function of the cell.

FIG. 8 shows the 2-input NAND cell S1 among the various kinds of cells registered in the cell library 24. In FIG. 8, NA2 designates a library name of the NAND cell S1. A voltage between the terminals Vgs designates a voltage between the gate and the source, a voltage between the terminals Vds designates a voltage between the drain and the source, and a voltage between the terminals Vgd designates a voltage between the gate and the drain, respectively. In addition, although the voltages between the terminals Vgs, Vds and Vgd are targets for the evaluation in this embodiment, a back gate voltage and the like may be added to the targets for the evaluation. Furthermore, in FIG. 8, "1" corresponds to a case where a voltage between the terminals becomes a test voltage application state, and "0" corresponds to a case where a voltage between the terminals does not become the test voltage application state. Here, any one of the test voltages of the voltages between the terminals Vgs, Vds and Vgd is set to 3V while a power supply voltage is 6V at the time of the reliability test, and the case where the voltage between the terminals becomes the test voltage application state, that is, 3V or more, corresponds to "1" and other cases corresponds to "0". In addition, although test voltage of the voltage between the terminals Vgs, Vds and Vgd are all 3V in this embodiment, they may be different voltage values.

More specifically, at the time of acquiring the appearance transistor state, the transistor state acquiring means 254 acquires the correspondence data 26 from the HDD 20 first, and then acquires the appearance transistor state with respect to each transistor using the correspondence data 26. Here, for example, in the case of a transistor m0 of the NAND cell S1, when the appearance cell states of the NAND cell S1 are (1, 1) and (0, 1), the appearance transistor state (Vgs, Vds, Vgd) is (1, 0, 1) and when the appearance cell state is (1, 0), the appearance transistor state (Vgs, Vds, Vgd) is (1, 1, 0). That is, the appearance transistor state (Vgs, Vds, Vgd) of the transistor m0 are (1, 0, 1) and (1, 1, 0). Similarly, the appearance transistor states (Vgs, Vds, Vgd) of a transistor m1 are (1, 0, 1), (0, 0, 0) and (1, 1, 0), and the appearance transistor states (Vgs, Vds, Vgd) of a transistor m2 are (1, 0, 1), (0, 0, 0) and (1, 1, 0), and the appearance transistor states (Vgs, Vds, Vgd) of a transistor m3 are (0, 0, 0), (1, 0, 1) and (0, 1, 1). Similarly, the appearance transistor state is acquired for each of the transistors constituting the inverter cell S2 and the D flip-flop cell S3.

Then, as shown in FIG. 2, the test activity ratio calculating means 255 of the device of the present invention calculates the test activity ratio of the transistor using the corresponding appearance transistor state, with respect to each transistor (step #150, test activity ratio calculating step).

More specifically, in the test activity ratio calculating step of step 4150, the test activity ratio calculating means 255 in this embodiment acquires the terminals of the transistor whose voltage between the terminals could become a predetermined test voltage application state, in view of the constitution of the semiconductor integrated circuit, with respect to each transistor, as test possible terminals, and when all the voltages between the test possible terminals become the test voltage application state in the logic simulation in each transistor, it is determined that such transistor is in the test activity state. (step #151).

More specifically, in the case of the NAND cell S1, as shown in FIG. 7A, as for the transistor m0, all the terminal voltages Vgs, Vds and Vgd could become the test voltage application state in view of the constitution of the semiconductor integrated circuit. In addition, based on the appearance transistor states (1, 0, 1) and (1, 1, 0) of the transistor m0 acquired in the transistor state acquiring step of step #140, the voltage between the terminals Vgs becomes the test voltage application state when the appearance transistor states are (1, 0, 1) and (1, 1, 0), the voltage between the terminals Vds becomes the test voltage application state when the appearance transistor state is (1, 1, 0), and the voltage between the terminals Vgd becomes the test voltage application state when the appearance transistor state is (1, 0, 1). That is, in the case of the transistor m0 of the NAND cell S1, since all the voltages between the terminals Vgs, Vds and Vgd could become the test voltage application state in the logic simulation, it is determined that the transistor m0 is in the test activity state. Similarly, as for the transistors m1, m2 and m3 of the NAND cell S1 and the transistors constituting the inverter cell S2 and the D flip-flop S3, as shown in the correspondence data 26 shown in FIGS. 7 and 8, it is determined whether the voltage between the terminals could become the test voltage application state or not, and determined whether the transistor is in the test activity state or not.

In addition, in FIG. 8, when the input terminal B of the NAND cell is fixed to the logic value "0" for example, the possible cell states are only (0, 0) and (1, 0) in the transistor m3 constituting the NAND cell. In this case, the corresponding transistor states (0, 0, 0) and (1, 1, 0) are only possible states, the terminals of the transistor whose voltage could become the test voltage application state are the terminals between the gate and the source and between the drain and the source in view of the constitution of the semiconductor integrated circuit.

Then, the test activity ratio calculating means 255 calculates a ratio of the transistors determined as being in the test activity state to all of the transistors to be verified in the semiconductor integrated circuit, as a first test activity ratio (step #152, first test activity ratio calculating step). According to this embodiment, a value provided by dividing the number of the transistors determined as being in the test activity state in step #151 by the total number of the transistors contained in the NAND cell S1, the inverter cell S2 and the D flip-flop cell S3 is determined as the first test activity ratio.

Second Embodiment

A second embodiment of the method of the present invention and the device of the present invention will be described with reference to FIG. 9. In addition, in this embodiment, a case where a determination method of the test activity state is different from that of the first embodiment will be described.

A method of the present invention according to this embodiment will be described with reference to FIGS. 2 and 9 hereinafter.

Similarly to the first embodiment, data acquiring means 251 in a device in this embodiment of the present invention acquires a gate-level netlist 22 of a semiconductor integrated circuit to be verified, a reliability testing test pattern 23, a cell library 24 from a HDD 20 (step #110), and operation verifying means 252 starts a logic simulation program 21 and carries out a logic simulation at a gate level (step #120). In addition, the gate-level netlist 22 of the semiconductor integrated circuit, the reliability testing test pattern 23, and the cell library 24 in this embodiment are the same as those in the first embodiment.

Then, as shown in FIG. 2, cell state acquiring means 253 acquires an appearance cell state with respect to each cell (step #130, cell state acquiring step). The cell state acquiring means 253 in this embodiment additionally acquires an accumulated cell state appearance time by adding up appearance times of the cell state of each of a NAND cell S1, an inverter cell S2 and a D flip-flop cell S3 with respect to each cell state.

More specifically, as shown in FIG. 6B, as for the NAND cell S1, an accumulated cell state appearance time of a cell state (1, 1) is 10 ns, an accumulated cell state appearance time of a cell state (1, 0) is 10 ns, an accumulated cell state appearance time of a cell state (0, 1) is 6 ns, and an accumulated cell state appearance time of a cell state (0, 0) is 0 ns. Similarly, as for the inverter cell S2, an accumulated cell state appearance time of a cell state (1) is 15 ns, and an accumulated cell state appearance time of a cell state (0) is 11 ns, and as for the D flip-flop cell S3, an accumulated cell state appearance time of cell states (1, 1, 1) and (0, 1, 0) is 4 ns, an accumulated cell state appearance time of a cell state (1, 1, 0) is 1 ns, an accumulated cell state appearance time of cell states (1, 0, 1) and (1, 0, 0) is 5 ns, and an accumulated cell state appearance time of cell states (0, 1, 1), (0, 0, 1) and (0, 0, 0) is 0 ns.

Then, as shown in FIG. 2, transistor state acquiring means 254 acquires an appearance transistor state using the appearance cell state of the cell composed of the transistor, with respect to each transistor (step #140, transistor state acquiring step). The transistor state acquiring means 254 in this embodiment additionally acquires an appearance time of each appearance transistor state.

Then, as shown in FIG. 2, test activity ratio calculating means 255 calculates a test activity ratio of the transistor using the corresponding appearance transistor state, with respect to each transistor (step #150, test activity ratio calculating step).

According to this embodiment, the test activity ratio calculating means 255 acquires test possible terminals with respect to each transistor first, and calculates an accumulated test voltage application time with respect to each transistor by adding up times in which a voltage between the terminals becomes a test voltage application state in the logic simulation with respect to all of the test possible terminals in the semiconductor integrated circuit, using the appearance transistor state of each transistor and its appearance time. Furthermore, the test activity ratio calculating means 255 determines that the transistor, in which all the accumulated test voltage application times at all the test possible terminals of the transistor exceed a predetermined test voltage application state determination time, is in a test activity state with respect to each transistor (step #151).

Here, FIG. 9 shows an appearance time of each transistor state in a simulation result shown in FIG. 6 with respect to the NAND cell S1 of the semiconductor integrated circuit shown in FIG. 3. When it is assumed that the test voltage application state determination time is 1 ns, all the accumulated test voltage application times of the voltages between the terminals Vgs, Vds and Vgd of the transistors m0, m1, m2 and m3 constituting the NAND cell S1 are beyond the test voltage application state determination time. Therefore, it is determined that the transistors m0, m1, m2 and m3 are in the test activity state. In addition, although the test voltage application state determination time is set to 1 ns in this embodiment, the present invention is not limited to this and the time is appropriately set depending on the process and the characteristics of the semiconductor integrated circuit.

Furthermore, similarly to the first embodiment, the test activity ratio calculating means 255 calculates a ratio of the transistors determined as being in the test activity state to all the transistors to be verified in the semiconductor integrated circuit, as a first test activity ratio (step #152, first test activity ratio calculating step).

Third Embodiment

A third embodiment of the method of the present invention and the device of the present invention will be described with reference to FIG. 10. In addition, in this embodiment, a description will be made of a case where the contents of the test activity ratio are different from those of the first and second embodiments. More specifically, in the above first and second embodiments, the ratio of the transistors in the test activity state to the whole transistors in the semiconductor integrated circuit is calculated as a first test activity ratio whereas, in this embodiment, a second test activity ratio is calculated by adding up the ratios of the appearance transistor state to all the transistor states, for all the transistors in the semiconductor integrated circuit.

The method of the present invention in this embodiment will be described with reference to FIG. 10 hereinafter. Here, FIG. 10 shows a process procedure of the method of the present invention in this embodiment.

Similarly to the first and second embodiments, data acquiring means 251 of the device of the present invention in this embodiment acquires a gate-level netlist 22 of a semiconductor integrated circuit to be verified, a reliability testing test pattern 23, a cell library 24 from a HDD 20 (step #110) first, and operation verifying means 252 starts a logic simulation program 21 and carries out a logic simulation at a gate level (step #120). In addition, the gate-level netlist 22 of a semiconductor integrated circuit in this embodiment, the reliability testing test pattern 23, and the cell library 24 are the same as those in the first and second embodiments.

Figure 10:
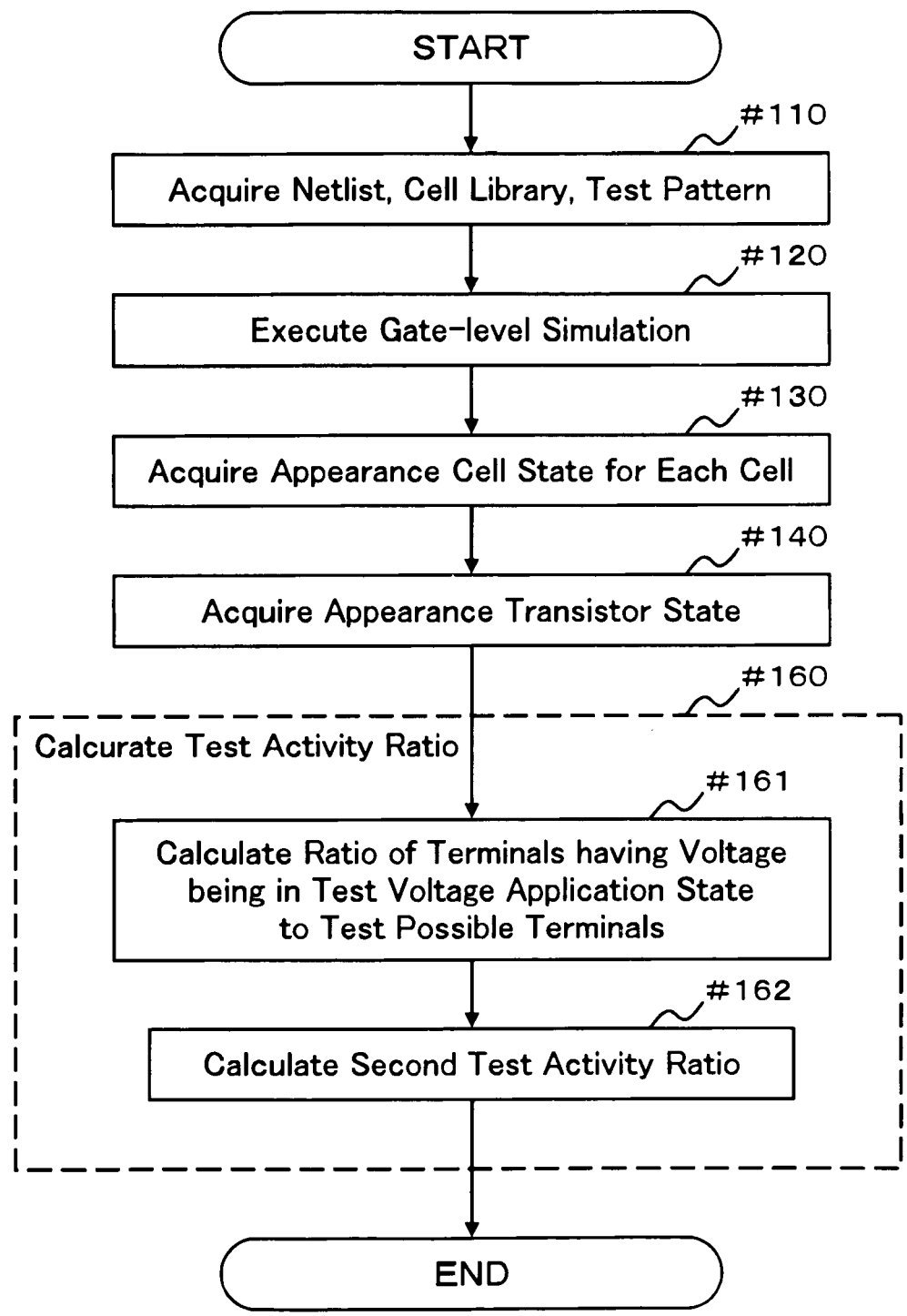
FIG. 10 is a flowchart showing a process procedure example of a test pattern evaluation method according to a third embodiment of the present invention.

Then, as shown in FIG. 10, cell state acquiring means 253 acquires an appearance cell state with respect to each cell (step #130, cell state acquiring step) similarly to the first embodiment. Transistor state acquiring means 254 acquires an appearance transistor state using the appearance cell state of the cell composed of the transistor with respect to each transistor (step #140, transistor state acquiring step) similarly to the first embodiment.

Then, as shown in FIG. 10, test activity ratio calculating means 255 calculates a test activity ratio of the transistor using the corresponding appearance transistor state with respect to each transistor (step #160, test activity ratio calculating step).

According to this embodiment, the test activity calculating means 255 acquires test possible terminals with respect to each transistor first, and calculates a ratio of the terminals whose voltage becomes the test voltage application state in the logic simulation to the test possible terminals, with respect to each transistor (step #161).

More specifically, according to the transistor m0 of the NAND cell S1 of the semiconductor integrated circuit shown in FIG. 3 all voltages between the terminals Vgs, Vds and Vgd could be the test voltage application state in view of the constitution of the semiconductor integrated circuit. In addition, as described in the first embodiment, all the voltages between the terminals Vgs, Vds and Vgd of the transistor m0 are in the test voltage application state in the logic simulation is some cases. Therefore, according to the transistor m0, the ratio of the terminals whose voltage becomes the test voltage application state in the logic simulation to the test possible terminals is 1=100%. As for transistors m1, m2 and m3, the ratio is 1 similarly.

In addition, the test activity ratio calculating means 255 calculates the second test activity ratio by adding the ratios of all the transistors to be verified in the semiconductor integrated circuit (step #162, second test activity ratio calculating step).

Fourth Embodiment

A fourth embodiment of the method of the present invention and the device of the present invention will be described with reference to FIGS. 10 and 11. In addition, in this embodiment, a description will be made of a case where the content of the test activity ratio are different from that of the third embodiment.

A method of the present invention in this embodiment will be described with reference to FIGS. 10 and 11 hereinafter.

Similarly to the first to third embodiments, data acquiring means 251 of the device of the present invention in this embodiment acquires a gate-level netlist 22 of a semiconductor integrated circuit to be verified, a reliability testing test pattern 23, a cell library 24 from a HDD 20 (step #110) first, and operation verifying means 252 starts a logic simulation program 21 and carries out a logic simulation at a gate level (step #120). In addition, the gate-level netlist 22 of a semiconductor integrated circuit in this embodiment, the reliability testing test pattern 23, and the cell library 24 are the same as those in the first to third embodiments.

Then, as shown in FIG. 10, cell state acquiring means 253 acquires an appearance cell state with respect to each cell (step #130, cell state acquiring step) similarly to the second embodiment. Furthermore, it acquires an accumulated cell state appearance time provided by adding up appearance times of a cell state with respect to each cell state of each of a NAND cell S1, an inverter cell S2 and a D flip-flop cell S3.

Then, as shown in FIG. 10, transistor state acquiring means 254 acquires an appearance transistor state using the appearance cell state of the cell composed of the transistor with respect to each transistor (step #140, transistor state acquiring step) similarly to the second embodiment, and acquires an appearance time of each appearance transistor state.

Then, as shown in FIG. 10, test activity ratio calculating means 255 calculates a test activity ratio of the transistor using the corresponding appearance transistor state with respect to each transistor (step #160, test activity ratio calculating step).

According to this embodiment, the test activity calculating means 255 acquires a test possible terminals with respect to each transistor first, and calculates an accumulated test voltage application time provided by adding up times in which a voltage between the terminals becomes a test voltage application state in a logic simulation with respect to all the test possible terminals in the semiconductor integrated circuit using each appearance transistor state and its appearance time, with respect to each transistor. Furthermore, the test activity ratio calculating means 255 calculates a ratio of the terminals in which the accumulated test voltage application times exceed a predetermined test voltage application state determination time, to all the test possible terminals in the transistor, with respect to each transistor (step #161).

Here, FIG. 11 shows one example of a calculated result of the accumulated test voltage application time of the terminals of each transistor with respect to a simulation time. In FIG. 11, vgs_active_time designates an accumulated test voltage application time between the gate and the source, vds_active_time designates an accumulated test voltage application time between the drain and the source, vgd_active_time designates an accumulated test voltage application time between the gate and the drain. According to this embodiment, assuming the test voltage application state determination time to be 1 ns, a ratio of the terminals in which the accumulated test voltage application times exceed 1 ns, to all the test possible terminals in the transistor is calculated. In FIG. 11, in the case of a transistor m0, since the accumulated test voltage application times exceed 1 ns in all between the gate and source, between the drain and source, and between the gate and drain, the ratio of these terminals to the test possible terminals is 1=100%.

In addition, the test activity ratio calculating means 255 calculates a second test activity ratio by adding the ratios calculated in step #161 with respect to all the transistors to be verified in the semiconductor integrated circuit, similarly to the third embodiment (step #162, second test activity ratio calculating step).

Fifth Embodiment

A fifth embodiment of the method of the present invention and the device of the present invention will be described with reference to FIGS. 12 to 15. In addition, a method for producing the correspondence data 26 used in the first to fourth embodiments will be described in this embodiment.

Figure 12:
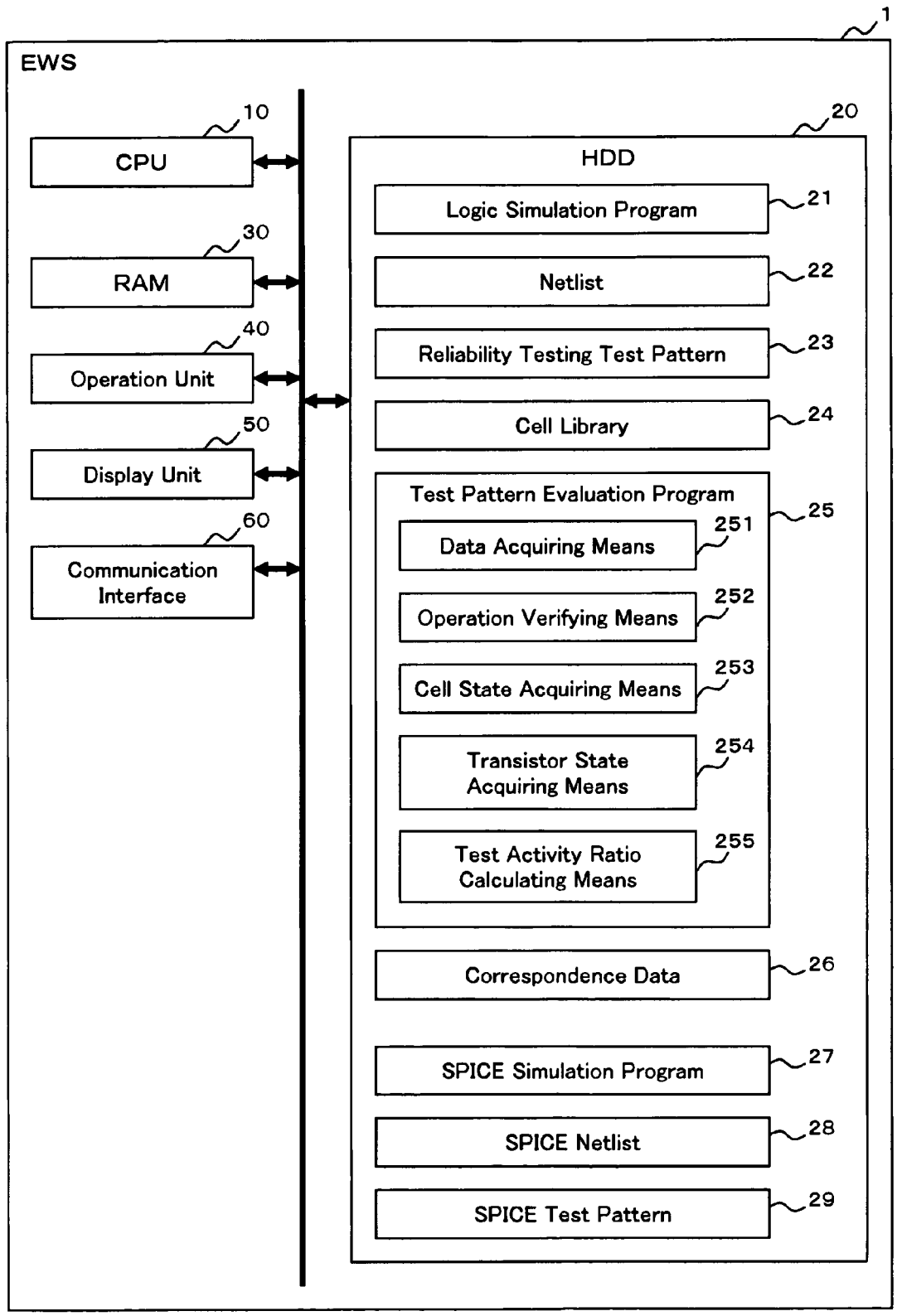
FIG. 12 is a block diagram showing a schematic partial constitution example of an EWS functioning as the test pattern evaluation device according to a fifth embodiment of the present invention.

First, a constitution of an EWS1 comprising the device of the present invention regarding the production of the correspondence data 26 will be described with reference to FIG. 12. Here, FIG. 12 shows a schematic partial constitution example of the EWS1 comprising the device of the present invention in this embodiment. The EWS1 according to this embodiment comprises the components of the EWS1 in the first to fourth embodiments shown in FIG. 1, that is, a CPU 10, a HDD 20, a RAM 30, an operation unit 40, a display unit 50 and a communication interface 60. The constitutions of the CPU 10, the RAM 30, the operation unit 40, the display unit 50 and the communication interface 60 are the same as those in the first to fourth embodiments.

In addition, according to this embodiment, a correspondence relation between a logic value of an input terminal of a cell and each of voltages Vgs, Vds and Vgd between the terminals of each transistor is acquired by carrying out a transistor-level simulation, a SPICE simulation here, with respect to each cell stored in a cell library 24, and a HDD 20 comprises a SPICE simulation program 27 for carrying out the SPICE simulation, a SPICE netlist 28 generated with respect to each function of the cell stored in the cell library 24; a SPICE, test pattern 29 generated with respect to each function of the cell stored in the cell library 24, in addition to each data in the first to fourth embodiments.

Figures 13, 14:
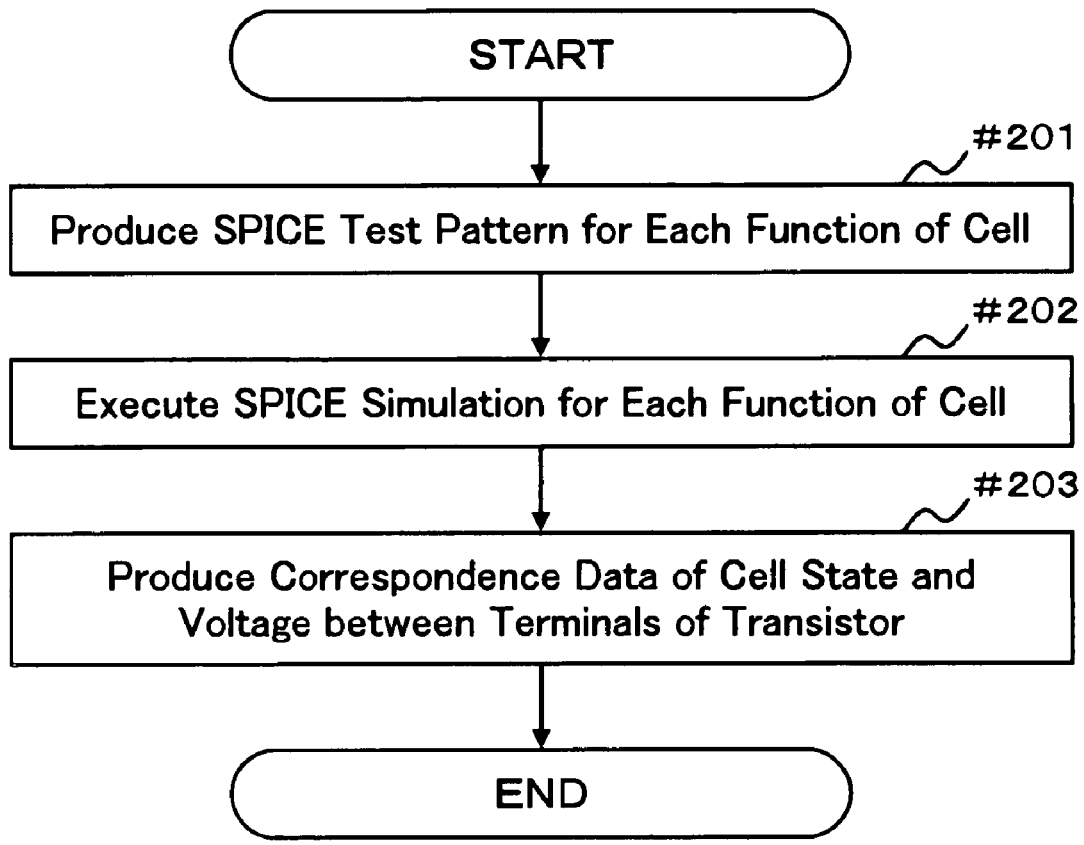
FIG. 13 is a flowchart showing a producing procedure example of correspondence data used in the test pattern evaluation method and the test pattern evaluation device according to the present invention.
FIG. 14 is a table showing a condition setting example of a SPICE simulation for a NAND cell.

The method for producing the correspondence data 26 will be described with reference to FIGS. 13 to 15 hereinafter. Here, FIG. 13 shows a production procedure of the correspondence data 26. In addition, in this embodiment, a description will be made of a case where a correspondence relation between a cell state and a voltage between the terminals of the transistor constituting the cell in a NAND cell S1 is acquired.

More specifically, as shown in FIG. 13, the SPICE test pattern 29 for carrying out the SPICE simulation for all the possible cell states of the NAND cell S1 is produced using the SPICE netlist 28 of the NAND cell S1 shown in FIG. 7B (step #201) first. Here, FIG. 14 shows a condition setting example of the SPICE simulation for the NAND cell S1. Since the cell state of the NAND cell S1 is determined by the logic value of the input terminal, FIG. 14 shows possible four combinations of the voltage values of input terminals A and B of the NAND cell S1. In FIG. 14, a voltage value 6V corresponds to a logic value "1" and a voltage value 0V corresponds to "0".

When the operation unit 40 requests to carry out the SPICE simulation, the EWS1 carries out the SPICE simulation with respect to each function of the cell (step #202). More specifically, in a sequential circuit such as a D flip-flop cell S3, since its cell state is defined by not only a logic value of an input terminal but also a logic value of an output terminal the SPICE simulation is performed not by a DC analysis in which it is difficult to control an output value but by transient analysis. Meanwhile, in a combination circuit such as the NAND cell S1, since its cell state is defined by the logic value of the input terminal, that is, since fine control of the output value is not required, the SPICE simulation can be performed by the DC analysis in which a simulation time is shorter than that of the transient analysis.

Here, FIG. 15 shows a result of the SPICE simulation and a correspondence relation between the cell state and the voltage between the terminals of the transistor. In FIG. 15, starting from the left column, a library name, an input terminal name of the cell, a logic value of the input terminal (cell state), a transistor name, a voltage between the terminals, a transistor state (logic value) are shown. When the voltage between the terminals exceeds a predetermined voltage value, 3V, for example, it is determined that the voltage between the terminals is in a test voltage application state and the transistor state is "1".

Then, as shown in FIG. 13, the device of the present invention produces the correspondence data 26 from the result of the SPICE simulation (step #203). More specifically, according to this embodiment, a correspondence relation between the logic value of each input terminal of the cell and the voltage between the terminals of the transistor (transistor state (logic value)) is extracted from a table shown in FIG. 15 and the correspondence data 26 shown in FIG. 8 is produced.

According to this embodiment, since the correspondence data 26 is produced using the result of the SPICE simulation at the transistor level even in the case of the evaluation of the reliability testing test pattern 23 based on the result of the logic simulation, by using the correspondence data 26 to acquire the appearance transistor state, the same evaluation precision as the case where the SPICE simulation at the transistor level is carried out using the reliability testing test pattern 23 can be provided. In addition, since the SPICE simulation is performed with respect to each function of the cell registered in the cell library 24, the simulation can be completed at a realistic time. In addition, since the correspondence data 26 can be applied to the semiconductor integrated circuit having the same process condition, it can be reused.

Sixth Embodiment

A sixth embodiment of the method of the present invention and the device of the present invention will be described with reference to FIG. 16. In addition, in this embodiment, a description will be made of a case where a first cell activity ratio is acquired using a cell state in the first to fifth embodiments.

The method of the present invention according to this embodiment will be described with reference to FIG. 16 hereinafter. Here, FIG. 16 shows a calculation procedure of the first cell activity ratio.

Figure 16:
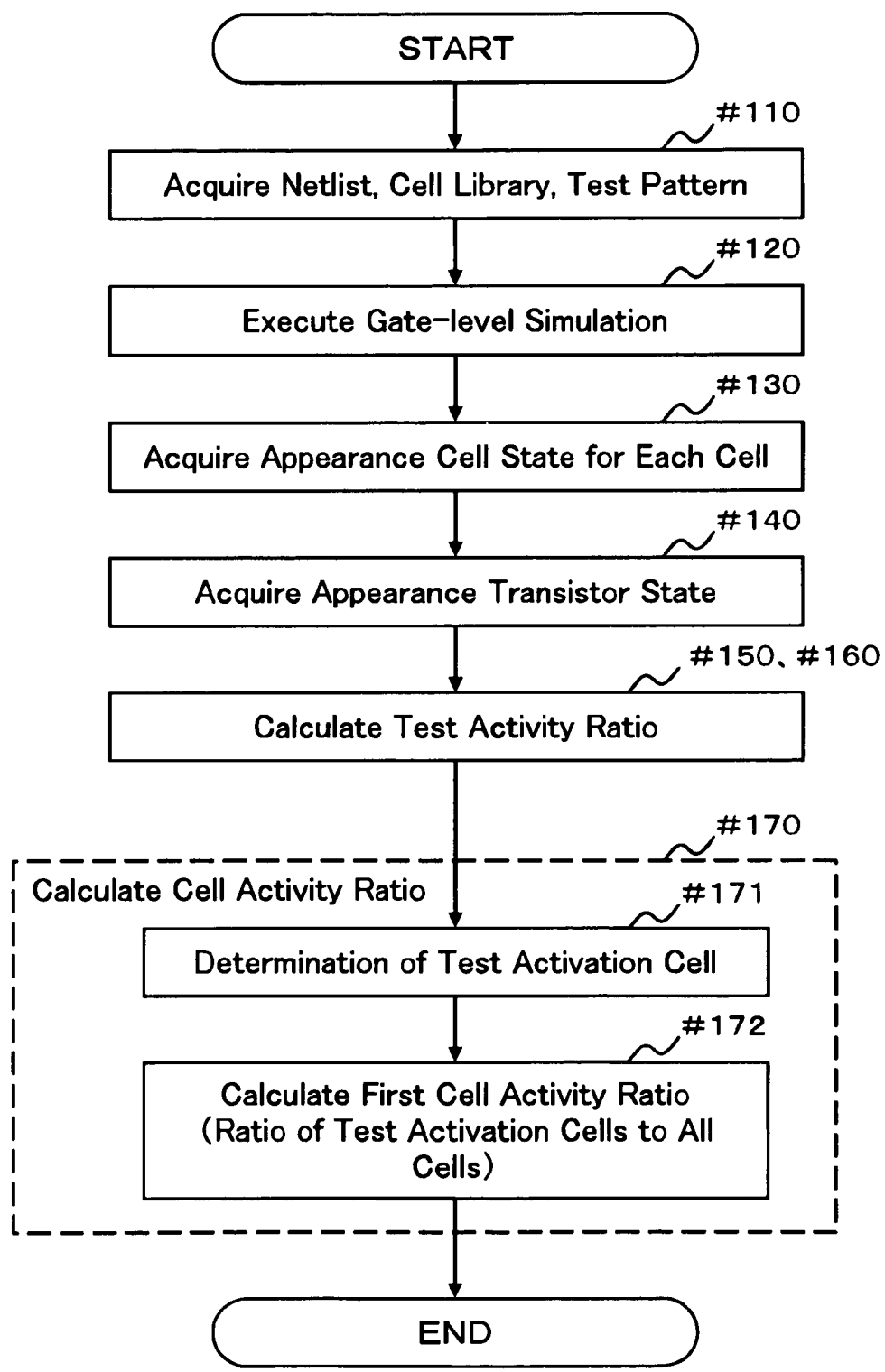
FIG. 16 is a flowchart showing a process procedure example of a test pattern evaluation method according to a sixth embodiment of the present invention.

The device of the present invention in this embodiment acquires an appearance cell state with respect to each cell from a result of a logic simulation at a gate level through step #110 to step #130 shown in FIG. 16, similarly to the first to fifth embodiments. Then, the device of the present invention calculates a test activity ratio using the appearance cell state of each cell (step #170).

More specifically, according to the device of the present invention in this embodiment, it is determined whether all the possible cell states of the cell appear or not using an appearance cell state of the cell with respect to each cell constituting the semiconductor integrated circuit, and the cell in which all the possible cell states appear is determined as a test activation cell (step #171).

More specifically, when the logic simulation is carried out for the semiconductor integrated circuit shown in FIG. 3 using the test pattern shown in FIG. 4, for example, since all the cell states that the cell can take appear in the inverter cell S2 among the cells constituting the semiconductor integrated circuit from the result shown in FIG. 6, the inverter cell S2 is determined as the test activation cell. Meanwhile, it is determined that the NAND cell S1 and the D flip-flop cell S3 in which all the possible cell states do not appear are not the test activation cells.

Then, the device of the present invention acquires a ratio of the test activation cells to all the cells to be verified in the semiconductor integrated circuit as a first cell activity ratio (step #172, a first cell activation determination step). More specifically, according to the device of the present invention, in the case of the semiconductor integrated circuit shown in FIG. 3, since only the inverter cell S2 among the three cells is determined as the test activation cell in step #171, the first cell activity ratio is 1/3=33.33%.

Seventh Embodiment

A seventh embodiment of the method of the present invention and the device of the present invention will be described with reference to the drawings. In addition, in this embodiment, a description will be made of a case where a determination condition of the test activation cell is different from that of the sixth embodiment.

The method of the present invention in this embodiment will be described with reference to FIG. 16.

The device of the present invention in this embodiment acquires an appearance cell state with respect to each cell from the result of the logic simulation at a gate level through step #110 to step #130 shown in FIG. 16 similarly to the sixth embodiment. According to this embodiment, in the cell state acquiring step of step #130, an accumulated cell state appearance time is acquired by adding up a time in which the cell state appears in the cell with respect to each cell state. Then, the device of the present invention calculates a test activity ratio using the appearance cell state in each cell (step #170).

More specifically, the device of the present invention in this embodiment determines with respect to each cell constituting the semiconductor integrated circuit that the cell in which the accumulated cell state appearance times of all the possible cell states that the cell can take, in view of the constitution of the semiconductor integrated circuit exceed a predetermined cell state appearance determination time is a test activation cell (step #171).

More specifically, similarly to the sixth embodiment, a description will be made of a case where the logic simulation is carried out for the semiconductor integrated circuit shown in FIG. 3 using the test pattern shown in FIG. 4. FIG. 6B shows the cell state and its accumulated cell state appearance time, and when assuming the cell state appearance determination time to he 1 ns, as for the NAND cell S1, the appearance cell states (A, B) are (1, 1), (1, 0) and (0, 1). Similarly, as for the inverter cell S2, its appearance cell states (A) are (1) and (0), and as for the D flip-flop cell S3, its appearance cell states (D, C, K, Q) are (1, 1, 1), (1, 0, 1), (1, 0, 0) and (0, 1, 0). Among the cells constituting the semiconductor integrated circuit, since all the possible cell states appear in the inverter cell S2, the inverter cell S2 is determined as the test activation cell. Meanwhile, it is determined that the NAND cell S1 and the D flip-flop cell S3 in which all the possible cell states do not appear are not the test activation cells. In addition, although the cell state appearance determination time is set to 1 ns in this embodiment, the present invention is not limited to this and it may be appropriately set depending on the process and the characteristics of the semiconductor integrated circuit.

Then, the device of the present invention acquires a ratio of the test activation cells to all the cells to be verified in the semiconductor integrated circuit as a first cell activity ratio (step #172, a first cell activation determination step). More specifically, according to the device of the present invention, similarly to the sixth embodiment, in the case of the semiconductor integrated circuit shown in FIG. 3, since only the inverter cell S2 among the three cells is determined to be the test activation cell in step #171, the first cell activity ratio is 1/3=33.33%.

Eighth Embodiment

An eighth embodiment of the method of the present invention and the device of the present invention will be described with reference to FIG. 17. In addition, in this embodiment, a case where a second cell activity ratio different from the first cell activity ratio described in the sixth and seventh embodiments will be described. More specifically, the ratio of the test activation cells to all the cells in the semiconductor integrated circuit is acquired as the first cell activity ratio in the sixth and seventh embodiments, whereas a second activity ratio is acquired by adding up the ratios of the appearance cell state to all the cell states of each cell over the whole semiconductor integrated circuit in this embodiment.

The method of the present invention in this embodiment will be described with reference to FIG. 17 hereinafter. Here, FIG. 17 shows a calculation procedure of the second cell activity ratio.

Figure 17:
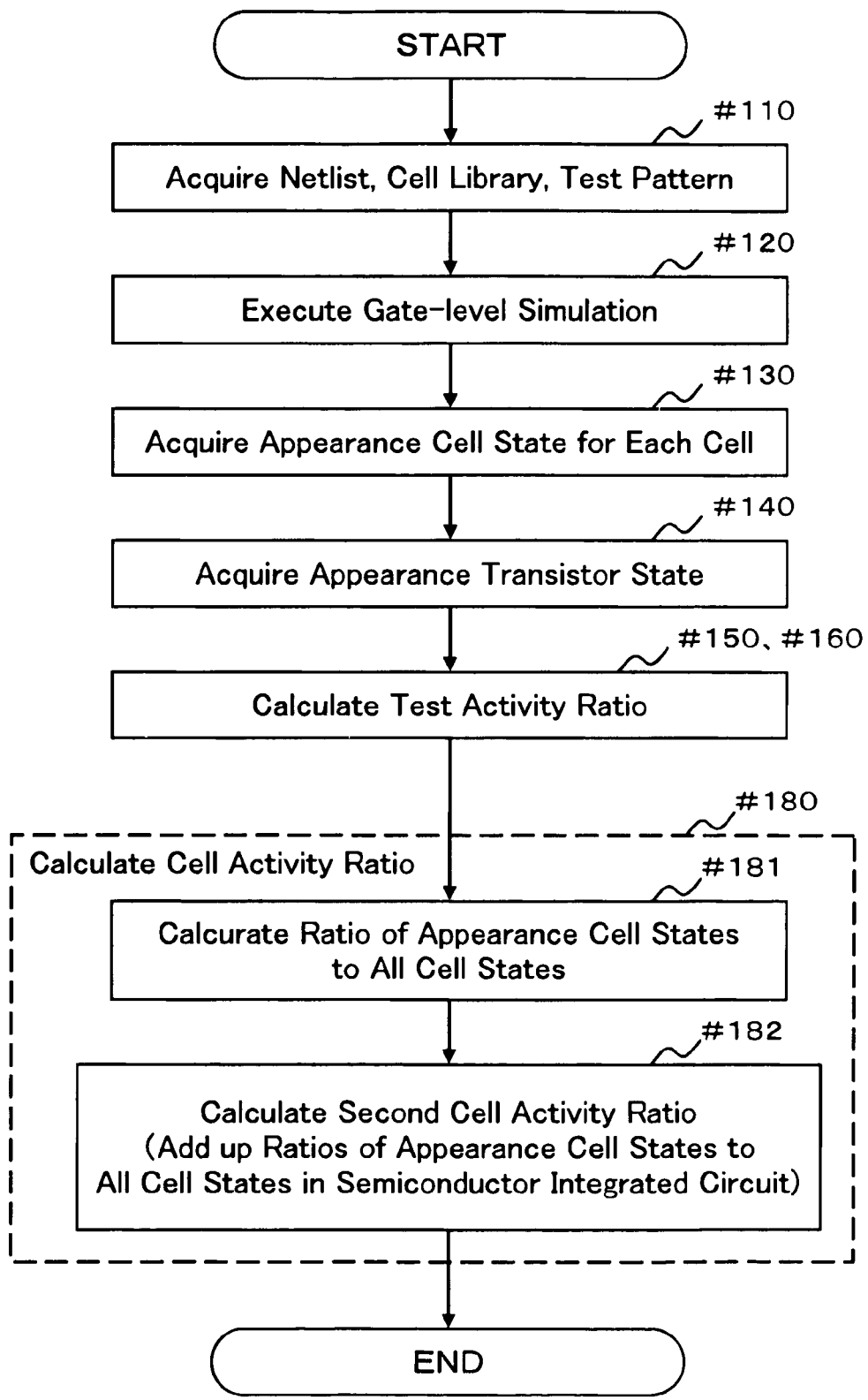
FIG. 17 is a flowchart showing a process procedure example of a test pattern evaluation method according to an eighth embodiment of the present invention.
Figure 18:
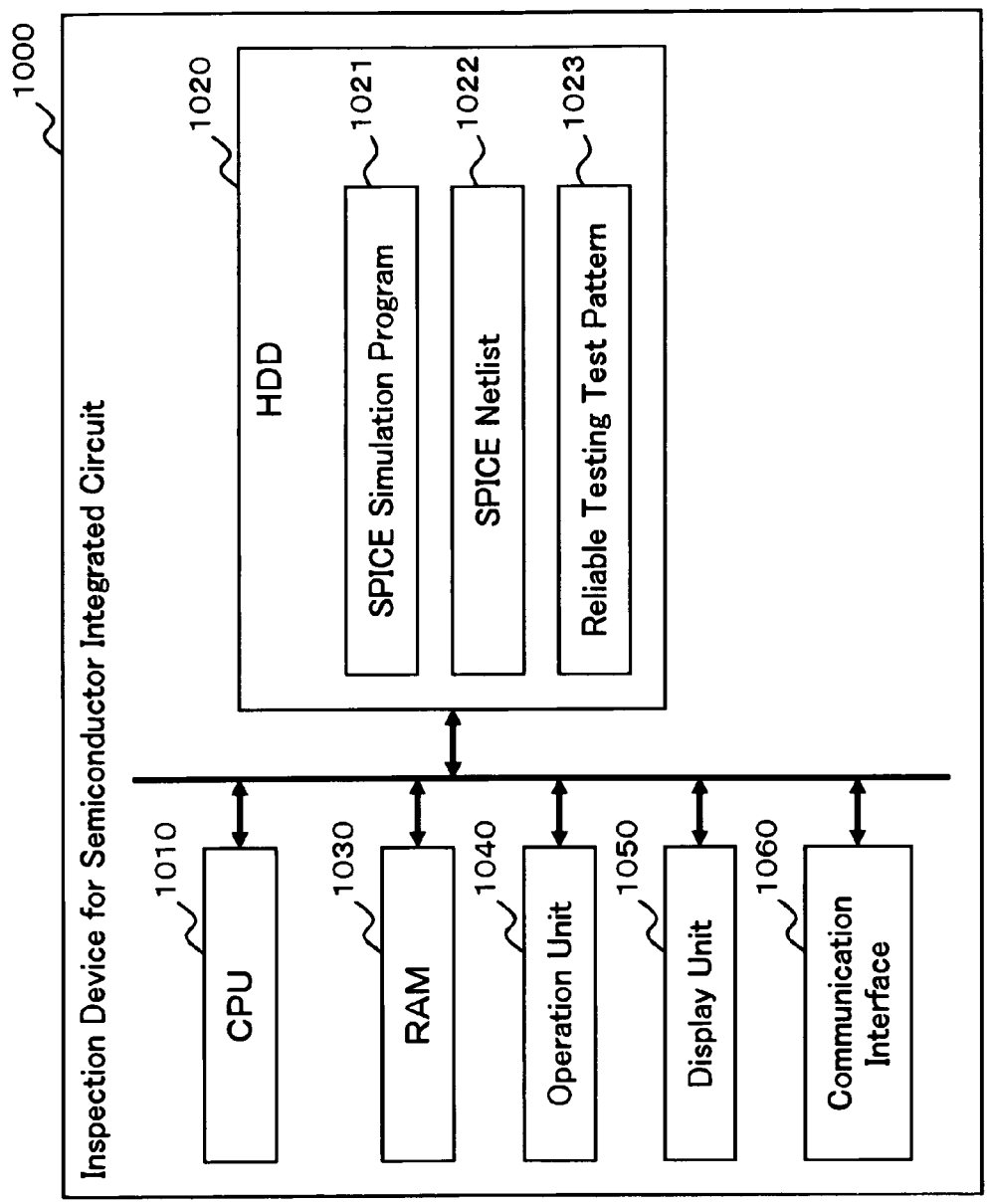
FIG. 18 is a block diagram showing a schematic partial constitution example of an inspection device of a semiconductor integrated circuit according to a conventional technique.
Figure 19:
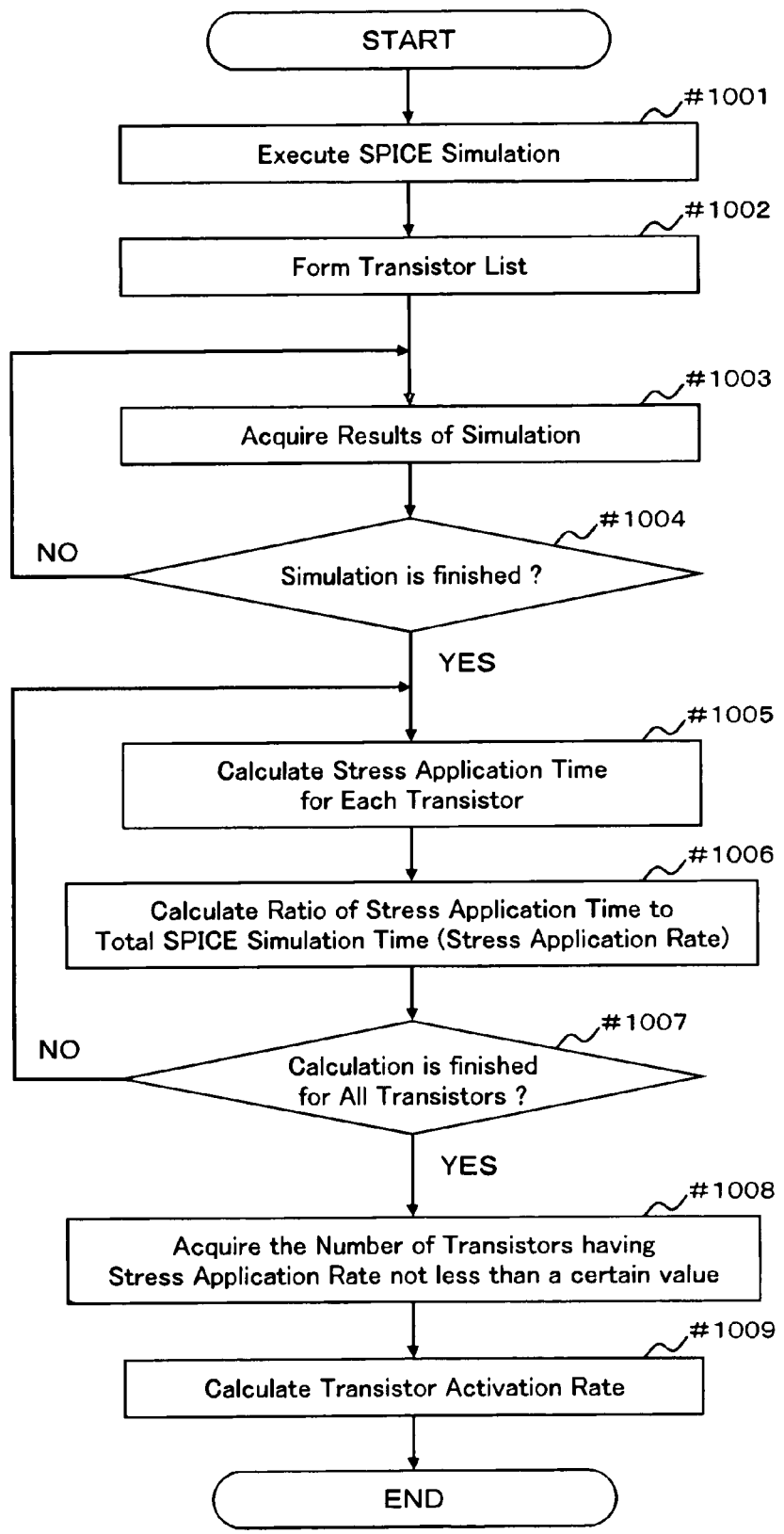
FIG. 19 is a flowchart showing a process procedure of an evaluation method of a reliability testing test pattern according to a conventional technique.

Similarly to the first to seventh embodiments, the device of the present invention in this embodiment acquires an appearance cell state with respect to each cell from the result of the logic simulation at a gate level through step #110 to step #130 shown in FIG. 17 and calculates a test activity ratio using the appearance cell state of each cell (step #180).

More specifically, the device of the present invention in this embodiment acquires the ratio of the appearance cell states to all the possible cell states that the cell can take in view of the constitution of the semiconductor integrated circuit, using the appearance cell state of the cell, with respect to each cell constituting the semiconductor integrated circuit (step #181).

More specifically, when the logic simulation is carried out using the test pattern shown in FIG. 4 for the semiconductor integrated circuit shown in FIG. 3, for example, as for the NAND cell S1, while the possible cell states that the cell can take are (1, 1), (1, 0), (0, 1) and (0, 0), the appearance cell states are (1, 1), (1, 0) and (0, 1) according to the result shown in FIG. 6. Therefore, the ratio of the appearance cell states to all the cell states the NAND cell S1 can take is 3/4. Similarly, as for the inverter cell S2, the ratio is 2/2=1, and as for the D flip-flop cell S3, the ratio is 5/8.

Then, the device of the present invention calculates the second cell activity ratio by adding up the ratios of all the cells to be verified in the semiconductor integrated circuit (step #182, second cell activity determining step). More specifically, in this case, the second activity ratio is acquired such that (3/4+2/2+5/8)/3=79.17% based on the result of step #181.

Ninth Embodiment

A ninth embodiment of the method of the present invention and the device of the present invention will be described with reference to the drawings. In addition, in this embodiment, a description will be made of a case where the determination condition of the test activation cell is different from that of the eighth embodiment.

The method of the present invention in this embodiment will be described with reference to FIG. 17 hereinafter.

The device of the present invention in this embodiment acquires an appearance cell state with respect to each cell based on the result of the logic simulation at a gate level through step #110 to step #130 shown in FIG. 17, similarly to the sixth embodiment. In addition, according to this embodiment, in the cell state acquiring step in step #130, an accumulated cell state appearance time is acquired by adding up appearance times in which the cell state appears in the cell with respect to each cell state. Then, the device of the present invention calculates a test activity ratio using the appearance cell state of each cell (step #180).

More specifically, the device of the present invention in this embodiment acquires a ratio of the cell states in which the accumulated cell state appearance times exceed a predetermined cell state appearance determination time, to all the possible cell states that the cell can take in view of the constitution of the semiconductor integrated circuit, with respect to each cell (step #181).

More specifically, in this embodiment, similarly to the eighth embodiment, a description will be made of a case where the logic simulation is carried out using the test pattern shown in FIG. 4 for the semiconductor integrated circuit shown in FIG. 3. FIG. 6B shows the cell state and its accumulated cell state appearance, time, and when assuming the cell state appearance determination time to be 1 ns, as for the NAND cell S1, the appearance cell states (A, B) are (1, 1), (1, 0) and (0, 1). Therefore, the ratio of the appearance cell states to all the possible cell states that the NAND cell S1 can take is 3/4. Similarly, as for the inverter cell S2, the appearance cell states (A) are (1) and (0), and the ratio of the appearance cell states to all the possible cell states that the inverter cell S2 can take is 2/2. As for the D flip-flop cell S3, the appearance cell states (D, CK, Q) are (1, 1, 1), (1, 0, 1), (1, 0, 0) and (0, 1, 0), and the ratio of the appearance cell states to all the possible cell states that the D flip-flop cell S3 can take is 5/8.

Then, the device of the present invention calculates a second cell activity ratio by adding the ratios of all the cells to be verified in the semiconductor integrated circuit (step #182, second cell activity determining step). More specifically, in this case, the second activity ratio is acquired such that (3/4+2/2+5/8)/3=79.17% based on the result of step #181.

Tenth Embodiment

A tenth embodiment of the method of the present invention and the device of the present invention will be described with reference to the drawings. In addition, a description will be made of a case where a test pattern is produced in order to improve a test activity ratio in this embodiment based on the appearance transistor state acquired in the first to ninth embodiments.

A description will be made of a case where a test pattern is produced when the operation verification is performed using the gate-level netlist shown in FIG. 3 and the test pattern shown in FIG. 4 in this embodiment. In addition, in order to simplify the description, it is assumed that patterns from 0 ns to 20 ns are the original test patterns and patterns from 21 ns to 26 ns are additional test patterns in the test patterns in FIG. 4.

The device of the present invention in this embodiment acquires a transistor state that does not appear for a predetermine time or more in the cell in the operation verification, as a non-appearance transistor state, based on the appearance transistor state (non-appearance transistor state detecting step).

More specifically, in the case of the NAND cell S1 shown in FIG. 3, the appearance cell states (A, B) of the cell states (A, B) are (1, 1) and (1, 0) from the result until 20 ns in the simulation result shown in FIG. 6. Since the NAND cell S1 comprises transistors m0 to m3 as shown in FIG. 7, based on the correspondence data 26 shown in FIG. 8, the appearance transistor states (Vgs, Vds, Vgd) of the transistor m0 are (1, 0, 1) and (1, 1, 0), the appearance transistor state (Vgs, Vds, Vgd) of the transistor m1 are (1, 0, 1) and (0, 0, 0), the appearance transistor states (Vgs, Vds, Vgd) of the transistor m2 are (0, 0, 0) and (1, 1, 0), and the appearance transistor states (Vgs, Vds, Vgd) of the transistor m3 are (1, 0, 1) and (0, 1, 1).

Therefore, non-appearance transistor state (Vgs, Vds, Vgd) of the transistors m0 and m3 is (0, 0, 0), non-appearance transistor state (Vgs, Vds, Vgd) of the transistor m1 is (1, 1, 0), and non-appearance transistor state (Vgs, Vds, Vgd) of the transistor m2 is (1, 0, 1).

Here, it is considered that the transistor in which all the voltages between the terminals could be in the test application state in the operation verification (the transistor determined as being in the activity state in step #51) does not contribute to the improvement of the test activity ratio even when the test pattern is added. Therefore, in this embodiment, the transistor determined as being in the test activity state is removed from the target for producing the test pattern even when the non-appearance transistor state exists.

More specifically, as for the transistors m0 and m3, since all the voltages between the terminals could be in the test application state, they are removed from the target for producing the test pattern and the non-appearance transistor state (Vgs, Vds, Vgd)=(1, 1, 0) of the transistor m1 and the non-appearance transistor state (Vgs, Vds, Vgd)=(1, 0, 1) of the transistor m2 are the non-appearance transistor states to be the target for producing the test pattern.

Then, the device of the present invention produces a test pattern to produce the non-appearance transistor state (first test pattern producing step). More specifically, as mentioned above, the transistor state (Vgs, Vds, Vgd)=(1, 1, 0) of the transistor m1, and the transistor state (Vgs, Vds, Vgd) =(1, 0, 1) of the transistor m2 are the non-appearance transistor states to be the target for producing the test pattern.

Referring to FIG. 8, the logic values of the input terminal A and the input terminal B of the NAND cell S1 corresponding to these non-appearance transistor states are such that the input terminal A is "0" and the input terminal B is "1", or both of the input terminal A and the input terminal B are "0". Here, a description will be made of the case where the test pattern in which the input terminal A is "0" and the input terminal B is "1" is added. As shown in FIG. 4, a pattern is added in which while "0" and "1" are inputted to the input terminal A and input terminal B of the semiconductor integrated circuit shown in FIG. 3, respectively, the CKB is changed from "1" to "0" (the patterns of 21 ns to 26 ns). Thus, the test application state can appear in all the voltages between the terminals of the transistor m2 and the transistor m3 in the operation verification, so that the test activity ratio can be improved and the precision of the reliability testing test pattern can be improved.

In addition, although a description has been made of the case where the test pattern in which the input terminal A is "0" and the input terminal B is "1" is added in this embodiment, the test pattern in which both of the input terminal A and the input terminal B are "0," may be added.

Eleventh Embodiment

An eleventh embodiment of the method of the present invention and the device of the present invention will be described with reference to the drawings. The test pattern is produced based on the appearance transistor state in the tenth embodiment whereas a description will be made of a case where a test pattern to improve the test activity ratio or the cell activity ratio is produced based on the appearance cell state in this embodiment.

A description will be made of a case where a test pattern is produced when the operation verification is performed using the gate-level netlist shown in FIG. 3 and the test pattern shown in FIG. 4 hereinafter.

The device of the present invention in this embodiment acquires a cell state that does not appear for a predetermined time or more in the operation verification, as a non-appearance cell state, based on the appearance cell state (non-appearance cell state detecting step). More specifically, as for the NAND cell S1 shown in FIG. 3, since the cell state (A, B) is defined by the logic values of the input terminal A and the input terminal B of the NAND cell S1, the appearance cell states (A, B) in the cell states (A, B) are (1, 1), (1, 0) and (0, 1). Therefore, the cell state (0, 0) of the NAND cell S1 is the non-appearance cell state.

Then, the device of the present invention produces a test pattern to produce the non-appearance cell state (second test pattern producing step). More specifically, in the test patterns shown in FIG. 4 for example, a pattern is added in which while "0" is inputted to both of the input terminal A and input terminal B of the semiconductor circuit shown in FIG. 3, the CKB is changed from "1" to "0". Thus, the test activity ratio and the cell activity ratio can be improved.

In addition, although the NAND cell S1 is illustrated in the description in this embodiment, another cell exists between the input terminal of the cell and the input terminal of the semiconductor integrated circuit in most of the cells constituting the semiconductor integrated circuit such as the D flip-flop cell S3 shown in FIG. 3. Therefore, when the test pattern is produced, it is necessary to set a logic value for each cell. In this case, a generally-used producing approach such as ATPG (Automatic Test Pattern Generator) or a technique such as a SCAN design may be used.

Another Embodiment (1) When the test activity ratio is less than 100% in the above first to eleventh embodiments, it may be constituted such that as for the transistor in which not all the possible transistor states appear, an instance name of the transistor, the non-appearance transistor state and the like may be outputted. In this constitution, the reliability testing test pattern to perform the reliability test can be easily added and modified for the transistor in which the reliability test cannot be performed with the already-produced reliability testing test pattern 23.

(2) Although a description has been made of the case where the test activity ratio is calculated for whole the semiconductor device in the first to eleventh embodiments, when the semiconductor device comprises a plurality of function blocks, it may be constituted such that the operation verification is performed not only for the whole semiconductor device but also for each function block and the test activity ratio is acquired with respect to each function block. In addition, it may be constituted such that the verification target is set with respect to each cell and the test activity ratio is acquired for each cell. Furthermore, it may be such that the plurality of verification targets such as the function block and the cell are set and the test activity ratio is calculated for each one of them. When the plurality of verification targets are set, a range of the verification target may partially or wholly overlap another range. In this constitution, the cell or the function block whose test activity ratio is low can be easily identified and the precision of the reliability testing test pattern can be more preferably improved.

(3) Although a description has been made of the case where the cell state and the transistor state are defined by the logic values in the above first to eleventh embodiments, they may be defined by voltage values.

(4) Although as for the combination circuit such as the NAND cell and the inverter cell, the cell state is defined by the logic value or the voltage value of the input terminal in the first to eleventh embodiments, the cell state may be defined by a logic value of the output terminal in addition to the value of the input terminal.

(5) Although a description has been made of the case where the logic simulation is performed at the gate level using the gate-level netlist 22 in the first to eleventh embodiments, a netlist in which RTL-level circuit expression and the like is mixed with the gate-level circuit expression may be used.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A test pattern evaluation method for evaluating a test pattern for verifying a semiconductor integrated circuit comprising a plurality of cells for implementing a specific function with a transistor, wherein it is assumed that each possible internal state of the cell determined at least by a logic value or a voltage value of an input terminal is a cell state, and each possible state of the transistor determined by a voltage between terminals of the transistor is a transistor state, the method comprising:

using a computer for: a step for verifying operation of the semiconductor integrated circuit at a gate level or higher using design data of the semiconductor integrated circuit and the test pattern;

a step for acquiring the cell state continuously appearing in the cell for a predetermined time or more in the step for verifying the operation as an appearance cell state, with respect to each cell constituting the semiconductor integrated circuit;

a step for acquiring the transistor state appearing in the transistor in the step for verifying the operation as an appearance transistor state, using the appearance cell state of the cell including the transistor, with respect to each transistor constituting the cell; and a step for calculating a test activity ratio of the transistor using the corresponding appearance transistor state, with respect to each transistor.

2. The test pattern evaluation method according to claim 1, wherein the step for calculating the test activity ratio includes:

acquiring terminals of the transistor whose voltage has a possibility of being in a predetermined test voltage application state in view of a constitution of the semiconductor integrated circuit, as test possible terminals; and determining that the transistor in which the voltages between all the test possible terminals are in the test voltage application state in the step for verifying the operation is in a test activity state, with respect to each transistor.

3. The test pattern evaluation method according to claim 2 further comprising a step for acquiring a ratio of the transistors determined as being in the test activity state to all the transistors to be verified in the semiconductor integrated circuit, as a first test activity ratio.

4. The test pattern evaluation method according to claim 1, wherein the step for acquiring the transistor state includes acquiring an appearance time of the appearance transistor state with respect to each transistor and the step for calculating the test activity ratio includes:

acquiring terminals of the transistor whose voltage has a possibility of being in a predetermined test voltage application state in view of a constitution of the semiconductor integrated circuit, as test possible terminals;

calculating an accumulated test voltage application time with respect to each transistor by adding up times in which the voltage between the terminals is in the test voltage application state in the step for verifying the operation, with respect to all the test possible terminals in the semiconductor integrated circuit, using the appearance transistor state and the appearance time of each transistor; and determining that the transistor in which the accumulated test voltage application times of all the test possible terminals exceed a predetermined test voltage application state determination time is in a test activity state with respect to each transistor.

5. The test pattern evaluation method according to claim 4 further comprising a step for acquiring a ratio of the transistors determined as being in the test activity state to all the transistors to be verified in the semiconductor integrated circuit, as a first test activity ratio.

6. The test pattern evaluation method according to claim 1, wherein the step for calculating the test activity ratio includes:

acquiring terminals of the transistor whose voltage has a possibility of being in a predetermined test voltage application state, in view of a constitution of the semiconductor integrated circuit, as test possible terminals;

acquiring a ratio of the transistor terminals having a voltage becoming the test voltage application state in the step for verifying the operation to the test possible terminals with respect to each transistor; and executing a step for calculating a second test activity ratio by adding up the ratios with respect to all the transistors to be verified in the semiconductor integrated circuit.

7. The test pattern evaluation method according to claim 1, wherein the step for acquiring the transistor state includes acquiring an appearance time of the appearance transistor state with respect to each transistor, and the step for calculating the test activity ratio includes:

acquiring terminals of the transistor whose voltage has a possibility of being in a predetermined test voltage application state, in view of a constitution of the semiconductor integrated circuit, as test possible terminals with respect to each transistor;

calculating an accumulated voltage application time with respect to each transistor by adding up times in which the voltage between the terminals is in the test voltage application state in the step for verifying the operation, with respect to all the test possible terminals in the semiconductor integrated circuit, using the appearance transistor state and the appearance time of each transistor;

acquiring a ratio of the terminals in which the accumulated test voltage application times exceed a predetermined test voltage application state determination time, to all the test possible terminals in the transistor, with respect to each transistor; and executing a step for calculating a second test activity ratio by adding up the ratios of all the transistors to be verified in the semiconductor integrated circuit.

8. The test pattern evaluation method according to claim 1 further comprising acquiring a correspondence data before the step for verifying the operation of the semiconductor integrated circuit, the correspondence data showing a correspondence relation between the cell state and a voltage between the terminals of the transistor constituting the cell with respect to each function of the cell, wherein the step for acquiring the transistor state includes acquiring the appearance transistor state using the appearance cell state of the cell including the transistor and the correspondence data, with respect to each transistor.

9. The test pattern evaluation method according to claim 1 further comprising:

determining whether all the possible cell states of the cell appear or not using the appearance cell state of the cell with respect to each cell, and determining the cell in which all the possible cell states appear, to be a test activation cell; and executing a step for acquiring a ratio of the test activation cells to all the cells to be verified in the semiconductor integrated circuit, as a first cell activity ratio.

10. The test pattern evaluation method according to claim 1, wherein the step for acquiring the cell state includes acquiring an accumulated cell state appearance time by adding up times in which the cell state appears in the cell with respect to each cell state, the method further comprising:

determining the cell in which the accumulated cell state appearance times of all the possible cell states of the cell in view of the constitution of the semiconductor integrated circuit exceed a predetermined cell state appearance determination time, to be a test activation cell; and executing a step for acquiring a ratio of the test activation cells to all the cells to be verified in the semiconductor integrated circuit, as a first cell activity ratio.

11. The test pattern evaluation method according to claim 1 further comprising:

acquiring a ratio of the appearance cell states to all the possible cell states of the cell in view of the constitution of the semiconductor integrated circuit, using the appearance cell state of the cell, with respect to each cell; and executing a step for calculating a second activity ratio by adding up the ratios of all the cells to be verified in the semiconductor integrated circuit.

12. The test pattern evaluation method according to claim 1, wherein the step for acquiring the cell state includes acquiring an accumulated cell state appearance time by adding up times in which the cell state appears in the cell with respect to the cell state, the method further comprising:

acquiring a ratio of the cell states in which the accumulated cell state appearance times exceed a predetermined cell state appearance determination time, to all the possible cell states of the cell in view of the constitution of the semiconductor integrated circuit, with respect to each cell; and executing a step for calculating a second cell activity ratio by adding up the ratios of all the cells to be verified in the semiconductor integrated circuit.

13. The test pattern evaluation method according to claim 1 further comprising:

a step for acquiring the transistor state not appearing for a predetermine time or more in the cell in the step for verifying the operation, as a non-appearance transistor state, based on the appearance transistor state; and a step for producing a test pattern to produce the non-appearance transistor state.

14. The test pattern evaluation method according to claim 1 comprising:

a step for acquiring the cell state not appearing for a predetermine time or more in the cell in the step for verifying the operation, as a non-appearance cell state, based on the appearance cell state; and a step for producing a test pattern to produce the non-appearance cell state.

15. A test pattern evaluation device for evaluating a test pattern for verifying a semiconductor integrated circuit comprising a plurality of cells for implementing a specific function with a transistor, wherein it is assumed that each possible internal state of the cell determined at least by a logic value or a voltage value of an input terminal is a cell state, and each possible state of the transistor determined by a voltage between the terminals of the transistor is a transistor state, the device comprising:

data acquiring means for acquiring design data of the semiconductor integrated circuit and the test pattern;

operation verifying means for executing operation verification of the semiconductor integrated circuit at a gate level or higher, using the design data and the test pattern;

cell state acquiring means for acquiring the cell state continuously appearing in the cell for a predetermined time or more in the operation verification as an appearance cell state, with respect to each cell constituting the semiconductor integrated circuit;

transistor state acquiring means for acquiring the transistor state appearing in the transistor in the operation verification as an appearance transistor state, using the appearance cell state of the cell including the transistor, with respect to each transistor constituting the cell; and test activity ratio calculating means for calculating a test activity ratio of the transistor using the corresponding appearance transistor state, with respect to each transistor.

* * * * *